US006624047B1

United States Patent
Sakaguchi et al.

(10) Patent No.: US 6,624,047 B1
(45) Date of Patent: Sep. 23, 2003

(54) SUBSTRATE AND METHOD OF MANUFACTURING THE SAME

(75) Inventors: Kiyofumi Sakaguchi, Yokohama (JP); Kazuaki Ohmi, Yokohama (JP); Kazutaka Yanagita, Yokohama (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 09/496,130

(22) Filed: Feb. 1, 2000

(30) Foreign Application Priority Data

Feb. 2, 1999 (JP) .......................... 11-025481

(51) Int. Cl.$^7$ .................. H01L 21/30; H01L 21/46; H01L 27/01
(52) U.S. Cl. ................ 438/458; 438/406; 438/409; 438/455; 438/456; 438/457; 438/459; 257/347
(58) Field of Search ............... 438/455, 456, 438/457, 458, 459, 406, 409; 257/347, 625

(56) References Cited

U.S. PATENT DOCUMENTS

| | | | | | |
|---|---|---|---|---|---|
| 3,898,107 | A | * | 8/1975 | Polinsky | 438/294 |
| 5,665,631 | A | * | 9/1997 | Lee et al. | 438/459 |
| 5,668,045 | A | * | 9/1997 | Golland et al. | 438/459 |
| 5,811,348 | A | * | 9/1998 | Matsushita et al. | 438/455 |
| 5,854,123 | A | * | 12/1998 | Sato et al. | 438/507 |
| 5,863,829 | A | * | 1/1999 | Nakayoshi et al. | 438/459 |
| 6,090,688 | A | * | 7/2000 | Ogawa et al. | 438/459 |
| 6,133,112 | A | * | 10/2000 | Iwane et al. | 438/409 |
| 6,171,982 | B1 | * | 1/2001 | Sato | 438/795 |
| 6,221,738 | B1 | | 4/2001 | Sakaguchi et al. | 438/455 |

FOREIGN PATENT DOCUMENTS

| | | | |
|---|---|---|---|
| EP | 793263 A2 | * 9/1997 | H01L/21/20 |
| JP | 5-021338 | 1/1993 | |
| JP | 7-302889 | 11/1995 | |
| KR | 0171067 | 7/1996 | |
| KR | 96-26066 | 7/1996 | |
| KR | 98-80687 | 11/1998 | |

OTHER PUBLICATIONS

Chu, "Microcavity Engineering Using Plasma Immersion Ion Implantation", Solid–State and Integrated Circuit Technology, 1998 5th International Conf., pp. 83–86, Oct. 21–23, 1998.*
"Electrolytic Shaping of Germanium and Silicon", *The Bell System Technical Journal*, Nov. 9, 1955, by A. Uhlir, Jr.
Imai et al., *Journal of Crystal Growth*, "Crystalline Quality of Silicon Layer Formed by FIPOS Technology", vol. 63, 547 (1983).
T. Unagami, *Journal of Electrochemical Society*, "Formation Mechanism of Porous Silicon Layer by Anodization in HF Solution", vol. 127, 476.
Nagano, et al., *IEICE Technical Report*, "Oxidized Porous Silicon and It's Application", vol. 79, SSD79–9549 (1979).
K. Imai, *Solid State Electronics*, "A New Dielectric Isolation Method Using Porous Silicon", vol. 24, 159 (1981).
R.P. Holmstrom and Y.Y. Chi, "Complete Dielectric Isolation By Highly Selective and Self–Stopping Formation of Oxidized Porous Silicon".

* cited by examiner

*Primary Examiner*—Matthew Smith
*Assistant Examiner*—Lex H. Malsawma
(74) *Attorney, Agent, or Firm*—Morgan & Finnegan, LLP

(57) ABSTRACT

In a method of manufacturing a bonded substrate stack by bonding a first substrate having a porous layer to a second substrate to prepare a bonded substrate stack, and separating the bonded substrate stack into two substrates at the porous layer, defects in the separation step are prevented. A first substrate having a porous layer inside, a single-crystal Si layer on the porous layer, and an SiO$_2$ layer on the single-crystal Si layer is bonded to a second substrate. The outer peripheral portion of the substrate is oxidized to make the outer peripheral edge of the single-crystal Si layer retreat toward the inside to prepare a bonded substrate stack in which the outer peripheral edge of the single-crystal Si layer is located inside the outer peripheral edge of the bonding region. After that, the bonded substrate stack is separated into two substrates at the porous layer.

64 Claims, 21 Drawing Sheets

SUBSTRATE AND METHOD OF MANUFACTURING THE SAME

BACKGROUND OF THE INVENTION

1. Field of the Invention

The present invention relates to a bonded substrate stack, a method of manufacturing the bonded substrate stack, and a method of manufacturing a substrate such as an SOI substrate using the bonded substrate stack.

2. Description of the Related Art

A substrate (SOI substrate) having an SOI (Silicon On Insulator) structure is known as a substrate having a single-crystal Si layer on an insulating layer. A device using this SOI substrate has many advantages that cannot be achieved by ordinary Si substrates. Examples of the advantages are as follows.

(1) The integration degree can be increased because dielectric isolation is easy.

(2) The radiation resistance can be increased.

(3) The operating speed of the device can be increased because the stray capacitance is small.

(4) No well step is necessary.

(5) Latch-up can be prevented.

(6) A complete depletion type field effect transistor can be formed by thin film formation.

Since an SOI structure has the above various advantages, researches have been made on its formation method for several decades.

As one SOI technology, the SOS (Silicon On Sapphire) technology by which Si is heteroepitaxially grown on a single-crystal sapphire substrate by CVD (Chemical Vapor Deposition) has been known for a long time. This SOS technology once earned a reputation as the most matured SOI technology. However, the SOS technology has not been put into practical use to date because, e.g., a large amount of crystal defects are produced by lattice mismatch in the interface between the Si layer and the underlying sapphire substrate, aluminum that forms the sapphire substrate mixes in the Si layer, the substrate is expensive, and it is difficult to obtain a large area.

Attempts have recently been made to realize the SOI structure without using any sapphire substrate. The attempts are roughly classified into two methods.

In the first method, the surface of a single-crystal Si substrate is oxidized, and a window is formed in the oxide film ($SiO_2$ layer) to partially expose the Si substrate. Single-crystal Si is epitaxially grown laterally using the exposed portion as a seed, thereby forming a single-crystal Si layer on $SiO_2$ (in this method, an Si layer is deposited on an $SiO_2$ layer).

In the second method, a single-crystal Si substrate itself is used as an active layer, and an $SiO_2$ layer is formed on the lower surface of the substrate (in this method, no Si layer is deposited).

As a means for realizing the first method, a method of directly epitaxially growing single-crystal Si in the horizontal direction from the single-crystal Si layer by CVD (CVD), a method of depositing amorphous Si and epitaxially growing single-crystal Si laterally in the solid phase by annealing (solid phase epitaxial growth), a method of irradiating an amorphous silicon layer or a polysilicon layer with a focused energy beam such as an electron beam or laser beam to grow a single-crystal Si layer on an $SiO_2$ layer by melting recrystallization (beam annealing), or a method of scanning band-shaped melting regions by a rod-like heater (zone melting recrystallization) is known.

All of these methods have both advantages and disadvantages and many problems of controllability, productivity, uniformity, and quality, and therefore have not been put into practical use in terms of industrial applications. For example, CVD requires sacrifice oxidation to form a flat thin film. Solid phase epitaxial growth is poor in crystallinity. In beam annealing, the process time required to scan the focused beam and controllability for beam superposition or focal point adjustment pose problems. Zone melting recrystallization is the most matured technique, and relatively large-scaled integrated circuits have been fabricated on a trial basis. However, since a number of crystal defects such as a subboundary undesirably remain, minority carrier devices cannot be created.

As the above second method, i.e., as the method without using the Si substrate as a seed for epitaxial growth, the following four techniques can be used.

As the first technique, an oxide film is formed on a single-crystal Si substrate having a V-shaped groove formed in the surface by anisotropic etching. A polysilicon layer having nearly the same thickness as that of the single-crystal Si substrate is deposited on the oxide film. After this, the single-crystal Si substrate is polished from the lower surface, thereby forming, on the thick polysilicon layer, a substrate having a single-crystal Si region surrounded and dielectrically isolated by the V-shaped groove. With this technique, a substrate having satisfactory crystallinity can be formed. However, there are problems of controllability and productivity in association with the process of depositing polysilicon as thick as several hundred micron or the process of polishing the single-crystal Si substrate from the lower surface to leave the isolated Si active layer.

The second technique is SIMOX (Separation by Ion Implanted Oxygen). In this technique, oxygen ions are implanted into a single-crystal Si substrate to form an $SiO_2$ layer. In this technique, to form an $SiO_2$ layer in a substrate, oxygen ions must be implanted at a dose of $10^{18}$ (ions/cm$^2$) or more. This implantation takes a long time to result in low productivity and high manufacturing cost. In addition, since a number of crystal defects are generated, the quality is too low to manufacture minority carrier devices.

As the third technique, an SOI structure is formed by dielectric isolation by oxidizing a porous Si layer. In this technique, an n-type Si island is formed on the surface of a p-type single-crystal Si substrate by proton ion implantation (Imai et al., J. Crystal Growth, vol. 63, 547 (1983)) or epitaxial growth and patterning. This substrate is anodized in an HF solution to convert only the p-type Si substrate around the n-type Si island into a porous structure. After this, the n-type Si island is dielectrically isolated by accelerated oxidation. In this technique, since the Si region to be isolated must be determined before the device process, the degree of freedom in device design is limited.

As the fourth technique, an SOI structure is formed by bonding a single-crystal Si substrate to another thermally oxidized single-crystal Si substrate by annealing or an adhesive. In this technique, an active layer for forming a device must be uniformly thin. More specifically, a single-crystal Si substrate having a thickness of several hundred micron must be thinned down to the micron order or less.

To thin the substrate, polishing or selective etching can be used.

A single-crystal Si substrate can hardly be uniformly thinned by polishing. Especially, thinning to the submicron order, the variation range is several ten %. As the wafer size becomes large, this difficulty becomes more pronounced.

Selective etching is effective to uniformly thin the substrate. However, the selectivity ratio is as low as about $10^2$, the surface planarity after etching is poor, and the crystallinity of the SOI layer is unsatisfactory.

A transparent substrate represented by a glass substrate is important in forming a contact sensor as a light-receiving element or a projection liquid crystal display device. To realize highly precise pixels (picture elements) having higher density and resolution for the sensor or display device, a high-performance driving element is required. For this purpose, a demand has arisen for a technique of forming a single-crystal Si layer having excellent crystallinity on a transparent substrate.

However, when an Si layer is deposited on a transparent substrate represented by a glass substrate, only an amorphous Si layer or a polysilicon layer is obtained. This is because the transparent substrate has an amorphous crystal structure, and the Si layer formed on the substrate reflects the disorderliness of the crystal structure of the transparent substrate.

The present applicant has disclosed a new SOI technology in Japanese Patent Laid-Open No. 5-21338. In this technique, a first substrate obtained by forming a porous layer on a single-crystal Si substrate and a non-porous single-crystal layer on its surface is bonded to a second substrate via an insulating layer. After this, the bonded substrate stack is separated into two substrates at the porous layer, thereby transferring the non-porous single-crystal layer to the second substrate. This technique is advantageous because the film thickness uniformity of the SOI layer is good, the crystal defect density in the SOI layer can be decreased, the surface planarity of the SOI layer is good, no expensive manufacturing apparatus with special specifications is required, and SOI substrates having about several hundred Å to 10-μm thick SOI films can be manufactured by a single manufacturing apparatus.

The present applicant has also disclosed, in Japanese Patent Laid-Open No. 7-302889, a technique of bonding first and second substrates, separating the first substrate from the second substrate without breaking the first substrate, smoothing the surface of the separated first substrate, forming a porous layer again on the first substrate, and reusing this substrate. Since the first substrate is not wasted, this technique is advantageous in largely reducing the manufacturing cost and simplifying the manufacturing process.

To separate the bonded substrate stack into two substrates without breaking the first and second substrates, for example, the two substrates are pulled in opposite directions while applying a force in a direction perpendicular to the bonding interface, a shearing force is applied parallel to the bonding interface (for example, the two substrates are moved in opposite directions in a plane parallel to the bonding interface, or the two substrates are rotated in opposite directions while applying a force in the circumferential direction), a pressure is applied in a direction perpendicular to the bonding interface, a wave energy such as an ultrasonic wave is applied to the separation region, a peeling member (e.g., a sharp blade such as knife) is inserted into the separation region parallel to the bonding interface from the side surface of the bonded substrate stack, the expansion energy of a substance filling the pores of the porous layer functioning as the separation region is used, the porous layer functioning as the separation region is thermally oxidized from the side surface of the bonded substrate stack to expand the volume of the porous layer and separate the substrates, or the porous layer functioning as the separation region is selectively etched from the side surface of the bonded substrate stack to separate the substrate.

Porous Si was found in 1956 by Uhlir et al. who were studying electropolishing of semiconductors (A. Uhlir, Bell Syst. Tech. J., vol. 35, 333 (1956)). Porous Si can be formed by anodizing an Si substrate in an HF solution.

Unagami et al. studied the dissolution reaction of Si upon anodizing and reported that holes were necessary for anodizing reaction of Si in an HF solution, and the reaction was as follows (T. Unagami, J. Electrochem. Soc., vol. 127, 476 (1980)).

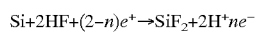
$Si+2HF+(2-n)e^+ \rightarrow SiF_2+2H^+ne^-$

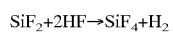
$SiF_2+2HF \rightarrow SiF_4+H_2$

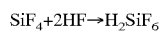
$SiF_4+2HF \rightarrow H_2SiF_6$ or

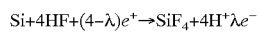
$Si+4HF+(4-\lambda)e^+ \rightarrow SiF_4+4H^+\lambda e^-$

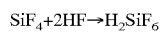
$SiF_4+2HF \rightarrow H_2SiF_6$ where $e^+$ and $e^-$ each represent a hole and an electron, respectively, and n and λ are the number of holes necessary to dissolve one Si atom. According to them, when n>2 or λ>4, porous Si is formed.

The above fact suggests that p-type Si having holes is converted into porous Si while n-type Si is not converted. The selectivity in this conversion has been reported by Nagano et at. and Imai (Nagano, Nakajima, Anno, Onaka, and Kajiwara, IEICE Technical Report, vol. 79, SSD79-9549 (1979)), (K. Imai, Solid-State Electronics, vol. 24, 159 (1981)).

However, it has also been reported that n-type at a high concentration is converted into porous Si (R. P. Holmstrom and J. Y. Chi, Appl. Phys. Lett., vol. 42, 386 (1983)). Hence, it is important to select a substrate which can be converted into a porous Si substrate independently of p- or n-type.

To form a porous layer, in addition to anodization, ions may be implanted into a silicon substrate.

For example, in the method described in Japanese Patent Laid-Open No. 5-21338, i.e., the method in which a substrate (to be referred to as a bonded substrate stack) obtained by bonding a first substrate having a non-porous layer such as a single-crystal Si layer on a porous layer to a second substrate via an insulating layer is separated at the porous layer, thereby transferring the non-porous layer formed on the first substrate side to the second substrate, the technique of separating the bonded substrate stack is very important.

For example, in separating the bonded substrate stack, if it is separated at a portion except the porous layer as the separation layer, the non-porous layer (e.g., a single-crystal Si layer) to be used as an active layer is broken, and no desired SOI substrate can be obtained.

SUMMARY OF THE INVENTION

The present invention has been made in consideration of the above situation, and has as its object to provide a bonded substrate stack capable of appropriately being separated at a porous layer, a method of manufacturing the bonded substrate stack, and a method of manufacturing a substrate such as an SOI substrate using the bonded substrate stack.

According to the first aspect of the present invention, there is provided a method of manufacturing a bonded substrate stack, comprising the first step of preparing a first substrate having a porous layer inside, a first layer on the porous layer, and a second layer on the first layer, the second step of bonding a major surface of the first substrate to a second substrate to prepare a bonded substrate stack, and the third step of chemically processing the bonded substrate stack to make at least part of an outer peripheral edge of the first layer retreat toward the inside of the bonded substrate stack.

In the bonded substrate stack manufacturing method according to the first aspect of the present invention, the third step preferably comprises, e.g., chemically processing the bonded substrate stack to obtain a structure in which at least part of the outer peripheral edge of the first layer of the bonded substrate stack is located at or inside an outer peripheral edge of a region where the first substrate and the second substrate are bonded.

In the bonded substrate stack manufacturing method according to the first aspect of the present invention, the third step preferably comprises, e.g., the step of oxidizing at least part of the outer peripheral portion of the first layer of the bonded substrate stack prepared in the second step.

In the bonded substrate stack manufacturing method according to the first aspect of the present invention, the third step preferably comprises, e.g., the step of etching at least part of the outer peripheral edge of the first layer of the bonded substrate stack prepared in the second step.

In the bonded substrate stack manufacturing method according to the first aspect of the present invention, the first layer is, e.g., a semiconductor layer.

In the bonded substrate stack manufacturing method according to first aspect of the present invention, the first layer is, e.g., an Si layer.

In the bonded substrate stack manufacturing method according to the first aspect of the present invention, the first layer is, e.g., a single-crystal Si layer.

In the bonded substrate stack manufacturing method according to the first aspect of the present invention, the first layer is, e.g., a compound semiconductor layer.

In the bonded substrate stack manufacturing method according to the first aspect of the present invention, the first step preferably comprises, e.g., the step of anodizing an Si substrate to form the porous layer.

In the bonded substrate stack manufacturing method according to the first aspect of the present invention, the first step preferably comprises, e.g., the step of implanting ions into an Si substrate to form the porous layer.

In the bonded substrate stack manufacturing method according to the first aspect of the present invention, for example, the first layer is an Si layer, and the second layer is an $SiO_2$ layer.

In the bonded substrate stack manufacturing method according to the first aspect of the present invention, the first step preferably comprises, e.g., the step of forming an Si layer serving as the first layer on the porous layer, and the step of thermally oxidizing a surface of the Si layer to form an $SiO_2$ layer serving as the second layer on the Si layer.

In the bonded substrate stack manufacturing method according to the first aspect of the present invention, the second substrate is, e.g., one of an Si substrate and a substrate having an $SiO_2$ layer on a surface of an Si substrate.

In the bonded substrate stack manufacturing method according to the first aspect of the present invention, the second substrate is, e.g., one of a transparent substrate and an insulating substrate.

According to the second aspect of the present invention, there is provided a method of manufacturing a bonded substrate stack, comprising the first step of preparing a first substrate having a porous layer inside, a first layer in a predetermined region on the porous layer, and a second layer that covers an upper surface and at least part of a side surface of the first layer, and the second step of bonding a major surface of the first substrate to a second substrate to prepare a bonded substrate stack.

In the bonded substrate stack manufacturing method according to the second aspect of the present invention, the first step preferably comprises, e.g., after the second step, forming the first layer and the second layer to obtain a structure in which at least part of an outer peripheral edge of the first layer is located inside an outer peripheral edge of a region where the first substrate and the second substrate are bonded.

In the bonded substrate stack manufacturing method according to the second aspect of the present invention, the first step preferably comprises, e.g., the step of forming a layer of a predetermined material on a substantially entire surface of the porous layer and patterning the layer to form the first layer.

In the bonded substrate stack manufacturing method according to the second aspect of the present invention, the first step preferably comprises, e.g., the step of growing the first layer having a predetermined shape on the porous layer.

In the bonded substrate stack manufacturing method according to the second aspect of the present invention, the first layer is, e.g., a semiconductor layer.

In the bonded substrate stack manufacturing method according to the second aspect of the present invention, the first layer is, e.g., an Si layer.

In the bonded substrate stack manufacturing method according to the second aspect of the present invention, the first layer is, e.g., a single-crystal Si layer.

In the bonded substrate stack manufacturing method according to the second aspect of the present invention, the first layer is, e.g. a compound semiconductor layer.

In the bonded substrate stack manufacturing method according to the second aspect of the present invention, the first step preferably comprises, e.g., the step of anodizing an Si substrate to form the porous layer.

In the bonded substrate stack manufacturing method according to the second aspect of the present invention, for example, the first layer is a n Si layer, and the second layer is a n $SiO_2$ layer.

In the bonded substrate stack manufacturing method according to the second aspect of the present invention, the first step preferably comprises, e.g., the step of forming an Si layer serving as the first layer on the porous layer, and the step of thermally oxidizing a surface of a substrate having the Si layer to form an $SiO_2$ layer serving as the second layer.

In the bonded substrate stack manufacturing method according to the second aspect of the present invention, the second substrate is, e.g., one of an Si substrate and a substrate having an $SiO_2$ layer on a surface of an Si substrate.

In the bonded substrate stack manufacturing method according to the second aspect of the present invention, the second substrate is, e.g., one of a transparent substrate and an insulating substrate.

According to the third aspect of the present invention, there is provided a method of manufacturing a bonded substrate stack, comprising the first step of preparing a first substrate having a porous layer inside, a first layer on a portion other than an outer peripheral portion of the porous layer, and a second layer that covers an upper surface of the first layer, and the second step of bonding a major surface of the first substrate to a second substrate to prepare a bonded substrate stack.

In the bonded substrate stack manufacturing method according to the third aspect of the present invention, the first step preferably comprises, e.g., preparing the first substrate having a structure in which the position of an outer peripheral edge of the first layer substantially matches that of an outer peripheral edge of the second layer.

In the bonded substrate stack manufacturing method according to the third aspect of the present invention, the first step preferably comprises, e.g., the step of forming a lower layer of a first material on a substantially entire surface of the porous layer, the step of forming an upper layer of a second material on a substantially entire surface of the lower layer, the step of removing an outer peripheral portion of the upper layer to form the second layer, and the step of removing an outer peripheral portion of the lower layer using the second layer as a mask pattern to form the first layer.

In the bonded substrate stack manufacturing method according to the third aspect of the present invention, the first step comprises the step of forming an Si layer on a substantially entire surface of the porous layer, the step of thermally oxidizing a surface of a substrate having the Si layer to form an $SiO_2$ layer, the step of removing an outer peripheral portion of the $SiO_2$ layer to form the second layer, and the step of removing an outer peripheral portion of the Si layer using the second layer as a mask pattern to form the first layer.

The bonded substrate stack manufacturing method according to the third aspect of the present invention preferably further comprises, e.g., the third step of chemically processing the bonded substrate stack prepared in the second step to locate at least part of an outer peripheral edge of the first layer at or inside an outer peripheral edge of a region where the first substrate and the second substrate are bonded.

In the bonded substrate stack manufacturing method according to the third aspect of the present invention, the third step preferably comprises, e.g., the step of oxidizing an outer peripheral portion of the bonded substrate stack prepared in the second step.

In the bonded substrate stack manufacturing method according to the third aspect of the present invention, the first layer is, e.g., a semiconductor layer.

In the bonded substrate stack manufacturing method according to the third aspect of the present invention, the first layer is, e.g., an Si layer.

In the bonded substrate stack manufacturing method according to the third aspect of the present invention, the first layer is, e.g., a single-crystal Si layer.

In the bonded substrate stack manufacturing method according to the third aspect of the present invention, the first layer is, e.g., a compound semiconductor layer.

In the bonded substrate stack manufacturing method according to the third aspect of the present invention, the first step preferably comprises, e.g., the step of anodizing an Si substrate to form the porous layer.

In the bonded substrate stack manufacturing method according to the third aspect of the present invention, the second substrate is, e.g., one of an Si substrate and a substrate having an $SiO_2$ layer on a surface of an Si substrate.

In the bonded substrate stack manufacturing method according to the third aspect of the present invention, the second substrate is, e.g., one of a transparent substrate and an insulating substrate.

According to the fourth aspect of the present invention, there is provided a method of manufacturing a bonded substrate stack, comprising the first step of preparing a first substrate having a porous layer inside, and a first layer on the porous layer, the second step of bonding a major surface of the first substrate to a second substrate to prepare a bonded substrate stack, and the third step of chemically processing the bonded substrate stack to make at least part of an outer peripheral edge of the first layer retreat toward the inside of the bonded substrate stack.

In the bonded substrate stack manufacturing method according to the fourth aspect of the present invention, the third step preferably comprises, e.g., the step of oxidizing at least part of the outer peripheral portion of the first layer of the bonded substrate stack prepared in the second step.

In the bonded substrate stack manufacturing method according to the fourth aspect of the present invention, the third step preferably comprises, e.g., the step of etching at least part of the outer peripheral edge of the first layer of the bonded substrate stack prepared in the second step.

According to the fifth aspect of the present invention, there is provided a method of manufacturing a bonded substrate stack, comprising the first step of preparing a first substrate having a porous layer inside, and a first layer on a portion other than an outer peripheral portion of the porous layer, and the step of bonding a major surface of the first substrate to a second substrate.

According to the sixth aspect of the present invention, there is provided a method of manufacturing a substrate, comprising the step of preparing a bonded substrate stack by one of the above bonded substrate stack manufacturing methods, and the step of separating the prepared bonded substrate stack into two substrates at the porous layer.

The bonded substrate stack manufacturing method according to the sixth aspect of the present invention preferably further comprises, e.g., the step of removing a porous layer remaining on a surface on a second substrate side of the two substrates separated in the separation step.

The bonded substrate stack manufacturing method according to the sixth aspect of the present invention preferably further comprises, e.g., the step of removing a porous layer remaining on a first substrate side of the two substrates separated in the separation step to enable reuse of the first substrate.

In the bonded substrate stack manufacturing method according to the sixth aspect of the present invention, the separation step preferably comprises, e.g., ejecting a fluid to a portion near a bonding interface of the bonded substrate stack and separating the bonded substrate stack into two substrates at the porous layer by the fluid.

According to the seventh aspect of the present invention, there is provided a bonded substrate stack having a structure in which a major surface of a first substrate having a porous layer inside, a first layer on the porous layer, and a second layer on the first layer is bonded to a second substrate, wherein at least part of an outer peripheral portion of the bonded substrate stack, an outer peripheral edge of the first layer is separated from an outer peripheral edge of the bonded substrate stack by a predetermined distance toward the inside.

According to the eighth aspect of the present invention, there is provided a bonded substrate stack having a structure in which a major surface of a first substrate having a porous layer inside, a first layer On the porous layer, and a second layer on the first layer is bonded to a second substrate, wherein at least part of an outer peripheral portion of the bonded substrate stack, an outer peripheral edge of the first layer is located at or inside an outer peripheral edge of the second layer.

According to the ninth aspect of the present invention, there is provided a bonded substrate stack having a structure in which a major surface of a first substrate having a porous layer inside, a first layer on the porous layer, and a second layer on the first layer is bonded to a second substrate, wherein at least part of an outer peripheral portion of the bonded substrate stack, an outer peripheral edge of the first layer is located at or inside an outer peripheral edge of a region where the first substrate and the second substrate are bonded.

According to the $10^{th}$ aspect of the present invention, there is provided a bonded substrate stack having a structure in which a major surface of a first substrate having a porous layer inside and a first layer on the porous layer is bonded to a second substrate, wherein at least part of an outer peripheral portion of the bonded substrate stack, an outer peripheral edge of the first layer is separated from an outer peripheral edge of the bonded substrate stack by a predetermined distance toward the inside.

According to the 11th aspect of the present invention, there is provided a method of manufacturing a bonded substrate stack, comprising the process step of chemically processing a bonded substrate stack in which a major surface of a first substrate having a porous layer inside, a first layer on the porous layer, and a second layer on the first layer is bonded to a second substrate to make at least part of an outer peripheral edge of the first layer retreat toward the inside of the bonded substrate stack.

In the bonded substrate stack manufacturing method according to the 11th aspect of the present invention, the process step preferably comprises, e.g., chemically processing the bonded substrate stack to obtain a structure in which at least part of the outer peripheral edge of the first layer of the bonded substrate stack is located at or inside an outer peripheral edge of a region where the first substrate and the second substrate are bonded.

In the bonded substrate stack manufacturing method according to the 11th aspect of the present invention, the process step preferably comprises, e.g., the step of oxidizing at least part of the outer peripheral portion of the first layer of the bonded substrate stack.

In the bonded substrate stack manufacturing method according to the 11th aspect of the present invention, the process step preferably comprises, e.g., the step of etching at least part of the outer peripheral edge of the first layer of the bonded substrate stack.

In the bonded substrate stack manufacturing method according to the 11th aspect of the present invention, the first layer is preferably, e.g., a semiconductor layer.

In the bonded substrate stack manufacturing method according to the 11th aspect of the present invention, the first layer is preferably, e.g., an Si layer.

In the bonded substrate stack manufacturing method according to the 11th aspect of the present invention, the first layer is preferably, e.g., a single-crystal Si layer.

In the bonded substrate stack manufacturing method according to the 11th aspect of the present invention, the first layer is preferably, e.g., a compound semiconductor layer.

In the bonded substrate stack manufacturing method according to the 11th aspect of the present invention, the porous layer of the first substrate is preferably, e.g., a porous layer formed by anodizing an Si substrate.

In the bonded substrate stack manufacturing method according to the 11th aspect of the present invention, the porous layer of the first substrate is preferably, e.g., a porous layer formed by implanting ions into an Si substrate.

In the bonded substrate stack manufacturing method according to the 11th aspect of the present invention, preferably, for example, the first layer is an Si layer, and the second layer is an $SiO_2$ layer.

In the bonded substrate stack manufacturing method according to the 11th aspect of the present invention, the second substrate is preferably, e.g., one of an Si substrate and a substrate having an $SiO_2$ layer on a surface of an Si substrate.

In the bonded substrate stack manufacturing method according to the 11th aspect of the present invention, the second substrate is preferably, e.g., one of a transparent substrate and an insulating substrate.

Further objects, features and advantages of the present invention will become apparent from the following detailed description of the embodiments of the present invention with reference to the accompanying drawings.

DETAILED DESCRIPTION OF THE PREFERRED EMBODIMENTS

For easy understanding of preferred embodiments of the present invention, a basic method of bonding a first substrate having a porous layer inside as a separation layer, and a non-porous layer on the porous layer to a second substrate to prepare a bonded substrate stack and separating the bonded substrate stack at the porous layer to transfer the non-porous layer (e.g., a single-crystal Si layer) to the second substrate, thereby manufacturing an SOI substrate will be briefly described first.

FIGS. 1A to 1E are sectional views for schematically explaining the basic method of manufacturing an SOI substrate. In the step shown in FIG. 1A, a single-crystal Si substrate 11 is prepared, and a porous Si layer 12 is formed on the surface of the single-crystal Si substrate 11 by, e.g., anodizing.

Figure 1A:
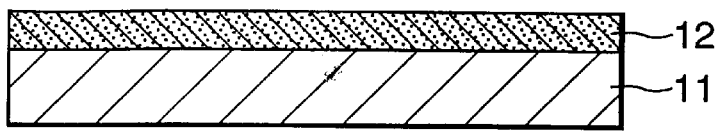
FIGS. 1A to 1E are sectional views for schematically explaining a basic method of manufacturing an SOI Substrate.
Figure 1B:
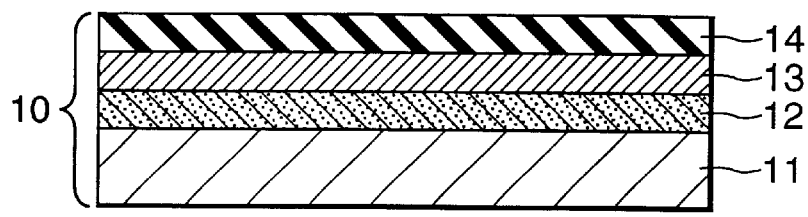

In the step shown in FIG. 1B, a non-porous ingle-crystal Si layer 13 is formed on the porous Si layer 12 by epitaxial growth. The surface of the non-porous single-crystal Si layer 13 is oxidized to form an SiO$_2$ layer 14. With this process, a first substrate 10 is formed. The porous Si layer 12 may be formed by, e.g., a method of implanting ions into the single-crystal Si substrate 11 (ion implantation). The porous Si layer formed by this method has a number of microcavities and is therefore called a microcavity layer.

Figure 1C:
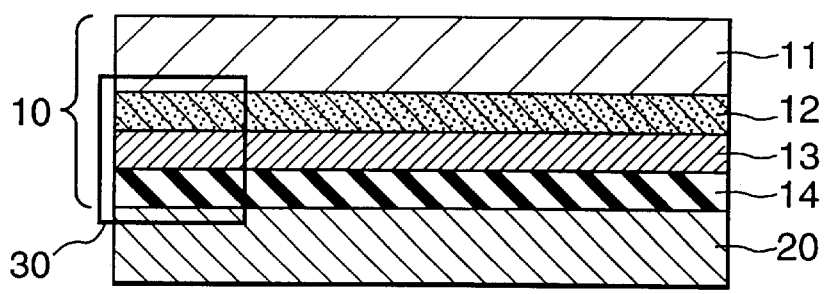

In the step shown in FIG. 1C, a second substrate 20 of single-crystal Si is prepared and brought into tight contact with the first substrate 10 at room temperature while making the insulating layer 14 oppose the second substrate. After this, the first substrate 10 and second substrate 20 are bonded by anodic bonding, pressing, heating, or a combination thereof. With this process, the second substrate 20 and insulating layer 14 are firmly bonded. The insulating layer 14 may be formed on the single-crystal Si layer 13, as described above. Alternatively, the insulating layer 14 may be formed either on the second substrate 20 or on both the non-porous single-crystal Si layer 13 and second substrate 20 as far as the state shown in FIG. 1C is obtained upon bringing the first and second substrates into tight contact with each other. However, when the insulating layer 14 is formed on the side of the single-crystal Si layer 13 serving as an active layer, the bonding interface between the first substrate 10 and the second substrate 20 can be separated from the active layer. For this reason, an SOI substrate having a higher quality can be obtained.

Figure 1D:
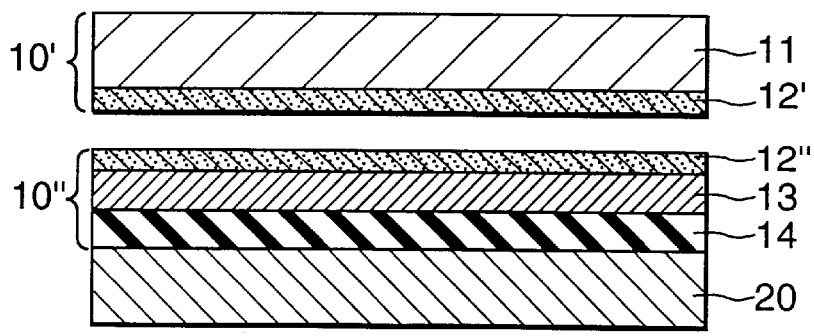

In the step shown in FIG. 1D, the two bonded substrates are separated into two substrates at the porous Si layer 12. The second substrate side (10"+20) has a multilayered structure of porous Si layer 12"/single-crystal Si layer 13/insulating layer 14/single-crystal Si substrate 20. The first substrate side 10' has a structure wherein a porous Si layer 12' is formed on the single-crystal Si substrate 11.

After the remaining porous Si layer 12' is removed, and the surface of the porous Si layer 12' is planarized as needed, the separated substrate 10' is used as a single-crystal Si substrate 11 for forming a first substrate 10 again.

Figure 1E:
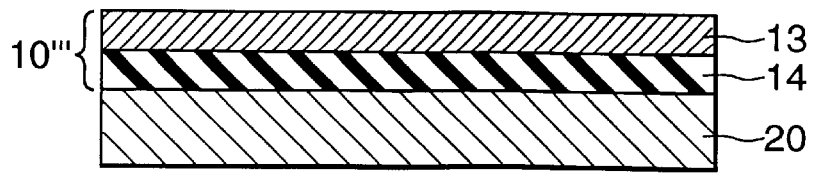

After the bonded substrate stack is separated, in the step shown in FIG. 1E, the porous layer 12" on the surface on the second substrate side (10"+20) is selectively removed. With this process, a substrate having a multilayered structure of a single-crystal Si layer 13/insulating layer 14/single-crystal Si substrate 20, i.e., an SOI structure is obtained.

As the second substrate, for example, not only a single-crystal Si substrate but also an insulating substrate (e.g., quartz substrate) or a transparent substrate (e.g., quartz substrate) can be used.

Figure 2:
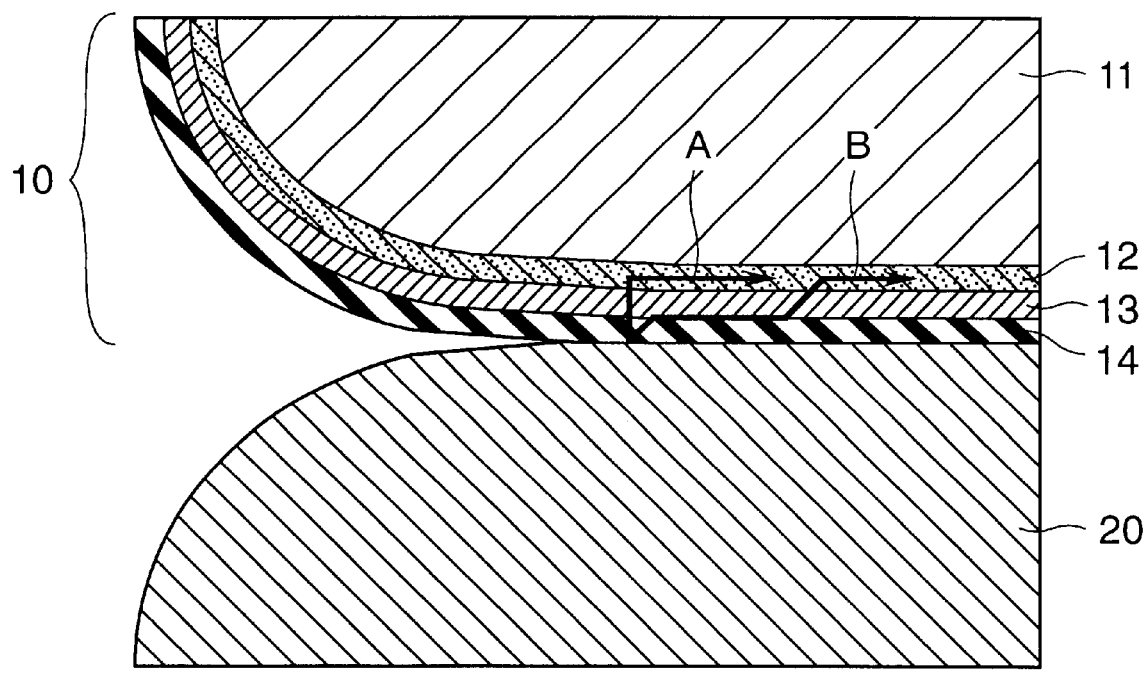
FIG. 2 is a sectional view for explaining the problem of the manufacturing method shown in FIGS. 1A to 1E.

FIG. 2 is a schematic enlarged view of a portion 30 shown in FIG. 1C. A problem in the separation process shown in FIG. 1D will be described below with reference to FIG. 2.

Generally, when a force is applied, using a wedge or the like, to the bonded substrate stack to separate it at the porous layer 12, the force concentrates on the bonding interface between the substrate 10 and the second substrate at the start of separation. For this reason, separation starts from the outer peripheral portion of the bonding interface of the bonded substrate stack, as indicated by an arrow A. Separation progresses toward the porous layer 12 as a separation layer having a fragile structure, as indicated by the arrow A. When the porous layer 12 starts to break, only the porous layer 12 is selectively broken to separate the bonded substrate stack into two substrates. In this case, the area of the single-crystal Si layer 13 as an active layer or the insulating layer 14 as the underlying layer of the active layer rarely decreases, and the bonded substrate stack is almost ideally separated.

A problem is posed when separation progresses as indicated by an arrow B. As is generally known, large stress is generated on the interface between two layers having different thermal expansion coefficients. More specifically, when an oxide film is formed on a single-crystal Si layer by thermally oxidizing the single-crystal Si layer, large stress is generated on the interface between the single-crystal Si layer and the oxide film.

Hence, when separation is progressing from the bonding interface to the porous layer 12 across the insulating layer 14 and single-crystal Si layer 13, separation may progress along the interface between the insulating layer 14 and the single-crystal Si layer 13. When separation progresses along the interface between the insulating layer 14 and the single-crystal Si layer 13, the single-crystal layer 13 breaks to reduce the region where an element is to be formed. If such phenomenon frequently occurs, the yield greatly decreases.

Embodiments to be described below disclose techniques of preventing the above problem, i.e., defects at the start of separation process.

[First Embodiment]

In the method according to this embodiment, after a first substrate 10 is bonded to a second substrate 20 to prepare a bonded substrate stack, the outer peripheral portion of the first layer (e.g., a single-crystal Si layer) formed on the porous layer of the first substrate 10 is oxidized to reduce the outer peripheral edge of the first layer toward the inside of the bonded substrate stack. In this method, the outer peripheral edge of the first layer is preferably located at or inside the outer peripheral edge of the bonding region (region where the first substrate 10 is bonded to the second substrate 20) of the first substrate 10 and second substrate 20.

When the region of the first layer is reduced, separation of the bonded substrate stack can be effectively prevented from progressing along the interface between the first layer and the second layer adjacent to the first layer.

FIGS. 3A to 3J are sectional views showing part of a semiconductor substrate manufacturing process according to the first embodiment of the present invention. FIGS. 3A to 3J show only part on the major surface side of the substrate, which corresponds to the portion 30 shown in FIG. 1C.

Figure 3A:
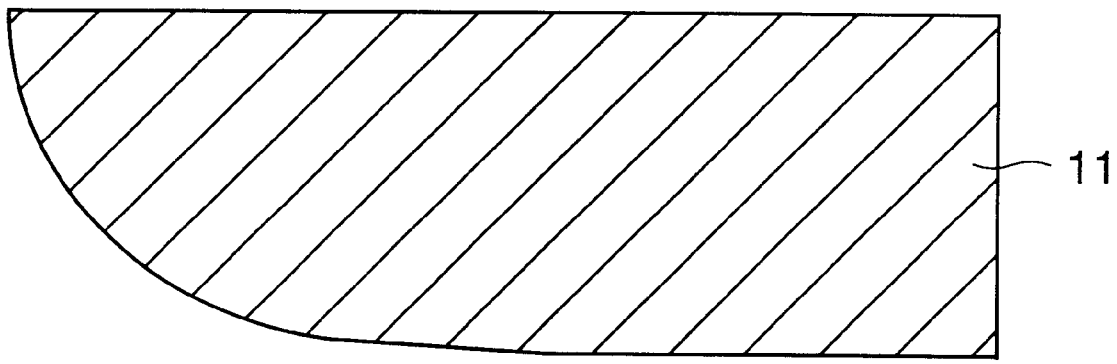
FIGS. 3A to 3J are sectional views showing part of a semiconductor substrate manufacturing process according to the first embodiment of the present invention.

Generally, a semiconductor substrate such as a single-crystal Si substrate is thinner at a portion separated from the outer peripheral edge by 1 to several mm than at the central portion because of polishing or etching even at the flat mirror surface portion inside the beveling portion, as shown in FIG. 3A.

Figure 3B:
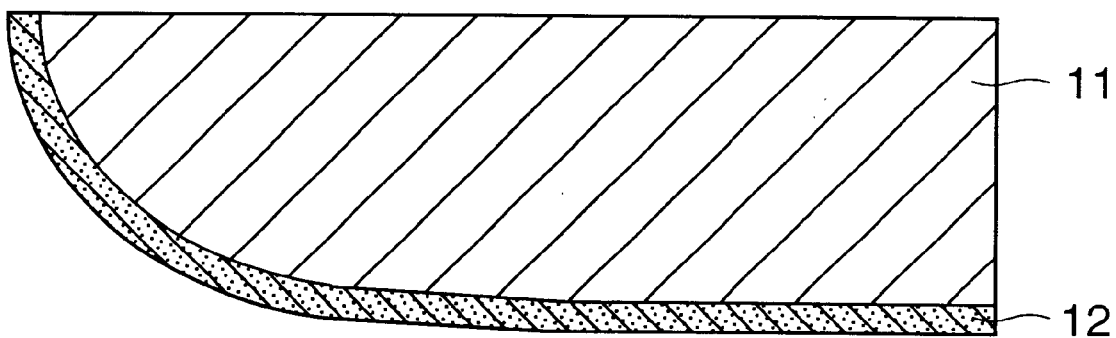

In the step shown in FIG. 3A, a semiconductor substrate 11 such as a single-crystal Si substrate is prepared. In the step shown in FIG. 3B, a porous layer 12 is formed on the major surface (mirror surface) side of the semiconductor substrate 11 by, e.g., anodizing. The region where the porous layer 12 is formed may extend to the outer peripheral edge or lower surface of the beveling portion of the semiconductor substrate 11, as shown in FIG. 3B, or may be smaller.

Figure 3C:
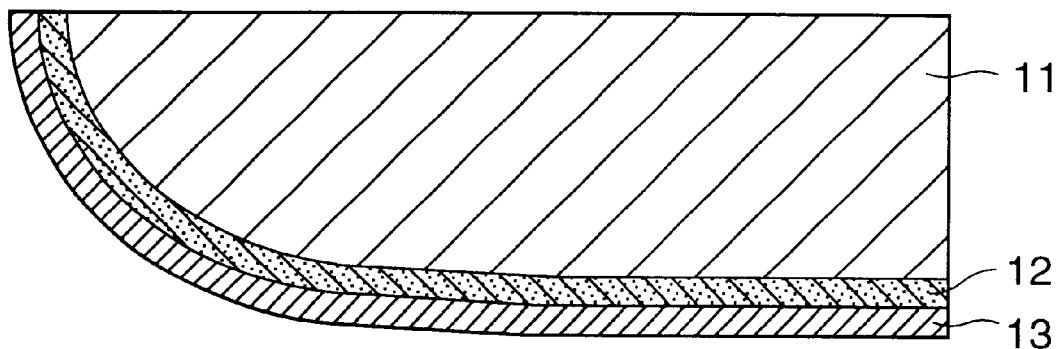

In the step shown in FIG. 3C, a first layer 13 is formed on the porous layer 12. As the first layer 13, for example, an Si layer such as a single-crystal Si layer, polysilicon layer, or amorphous Si layer is preferable. As the first layer 13, an element such as a MOSFET may be formed.

Figure 3D:
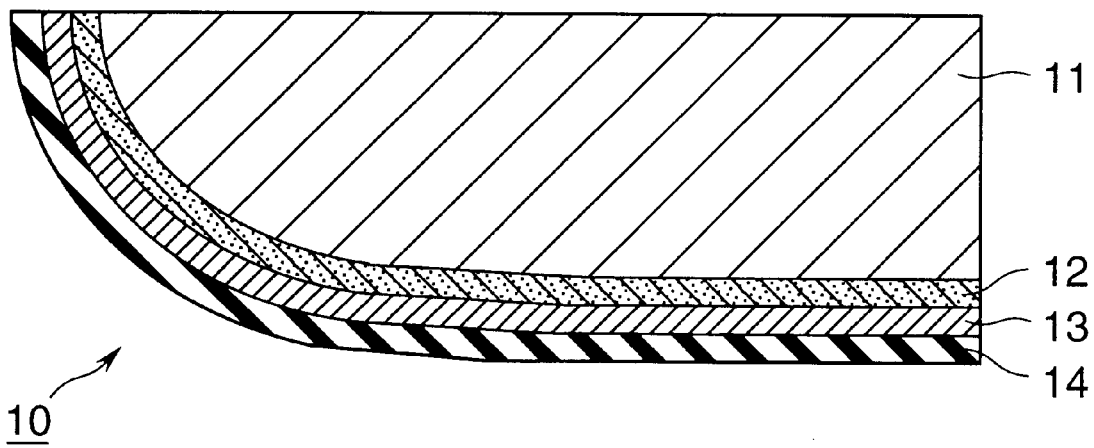

In the step shown in FIG. 3D, a second layer 14 is formed on the first layer 13. With this process, the first substrate 10 is obtained. As the second layer 14, an oxide layer (e.g., an SiO$_2$ layer) formed by oxidizing (e.g., thermally oxidizing) the surface of the first layer (Si layer) 13 is preferable.

Figure 3E:
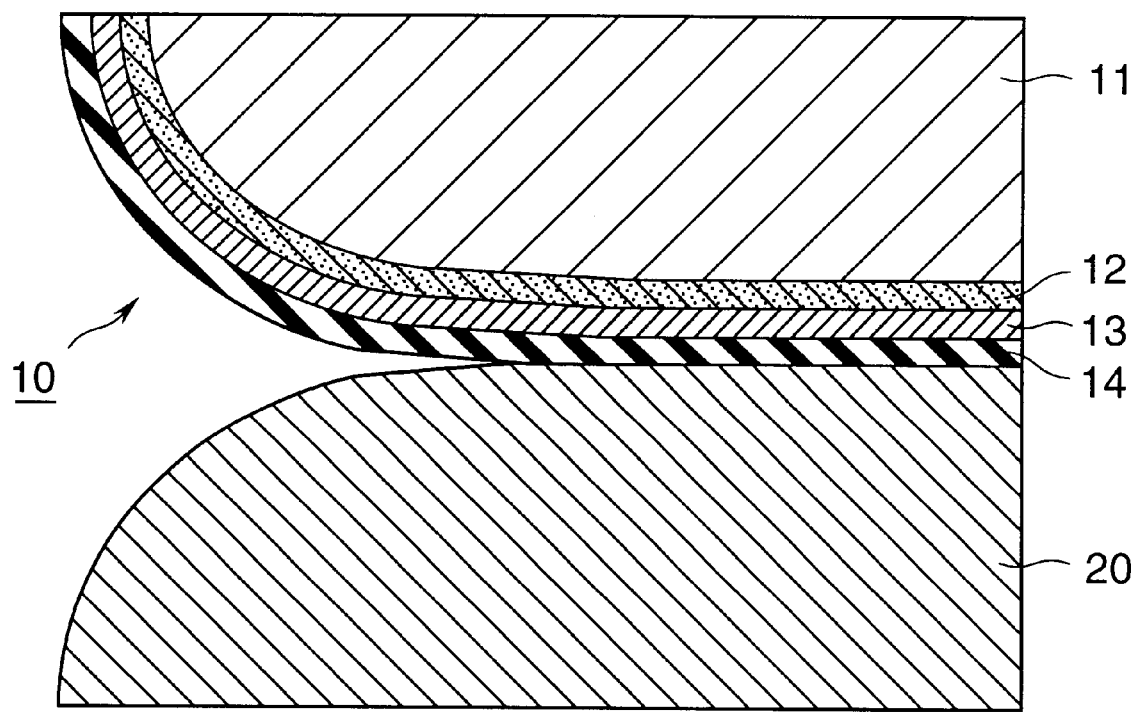

In the step shown in FIG. 3E, the major surface of the first substrate 10 and that of the second substrate 20 are brought into tight contact with each other at room temperature. After this, the first substrate 10 and second substrate 20 may be firmly bonded by anodic bonding, pressing, heating, or a combination thereof.

As the second substrate, an Si substrate, a substrate obtained by forming an insulating film on an Si substrate, an insulating substrate such as a quartz substrate, a transparent substrate such as a quartz substrate, or a sapphire substrate is preferable. However, the present invention is not limited to this, and any other substrate can be used as far as the surface to be bonded is sufficiently flat.

For example, when the second substrate 20 is an insulating substrate, or an insulating film is formed on the second substrate 20, the second layer 14 (the step shown in FIG. 3D) is not always necessary. However, when the second layer 14 is formed, the first layer 13 as an active layer can be apart from the bonding interface. When Si layers are to be bonded to each other to form a p-n diode, the second layer 14 is unnecessary.

A thin insulating plate may be inserted between the first substrate 10 and the second substrate 20 in bonding them.

Figure 3F:
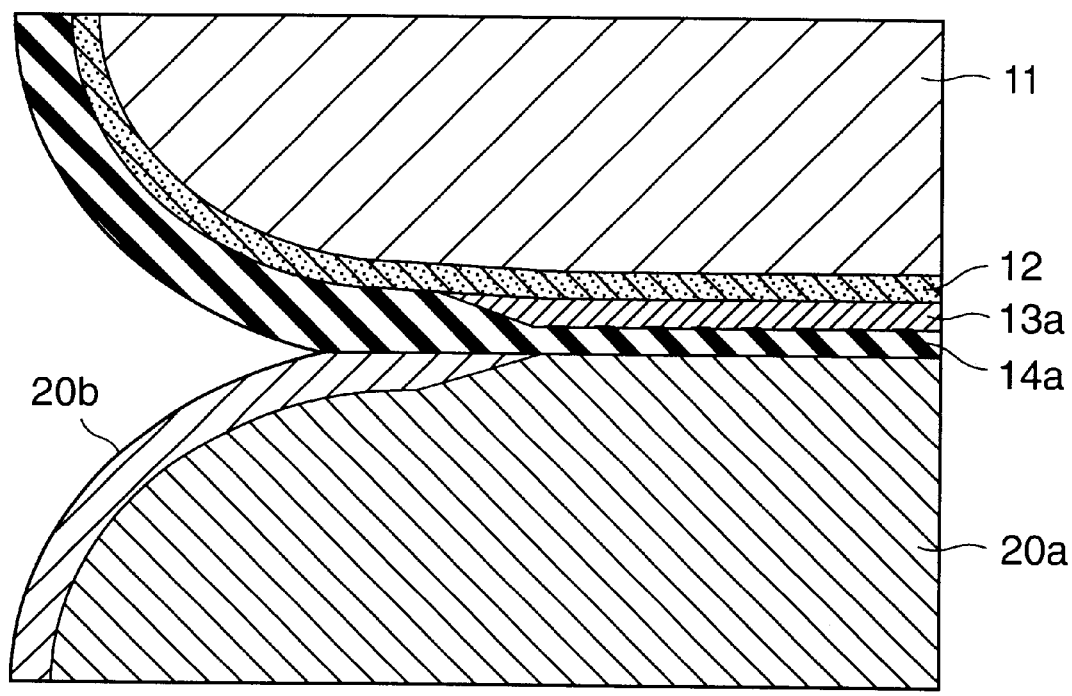

In the step shown in FIG. 3F, at least part (portion where separation starts in the separation process) of the entire outer peripheral portion of the bonded substrate stack shown in FIG. 3E is oxidized (e.g., thermally oxidized). In the example shown in FIG. 3F, the first layer 13 is an Si layer such as a single-crystal Si layer, the second layer 14 is an $SiO_2$ layer, and the second substrate is an Si substrate such as a single-crystal Si substrate.

In the example shown in FIG. 3F, the outer peripheral portion of the first layer 13 is oxidized via the second layer 14, the region of the first layer 13 is reduced toward the inside of the bonded substrate stack. Conversely, the bonding region extends toward the outer periphery as the first layer 13 and second substrate 20 are oxidized. Reference numeral 13a denotes a first layer after oxidation; 14a, a second layer after oxidation; 20a, a second substrate after oxidation; and 20b, an oxide film formed on the second substrate 20 by oxidation.

With this oxidation, a bonded substrate stack in which the outer peripheral portion of the first layer 13a is located inside the outer peripheral portion of the bonding region is obtained.

Figure 3G:
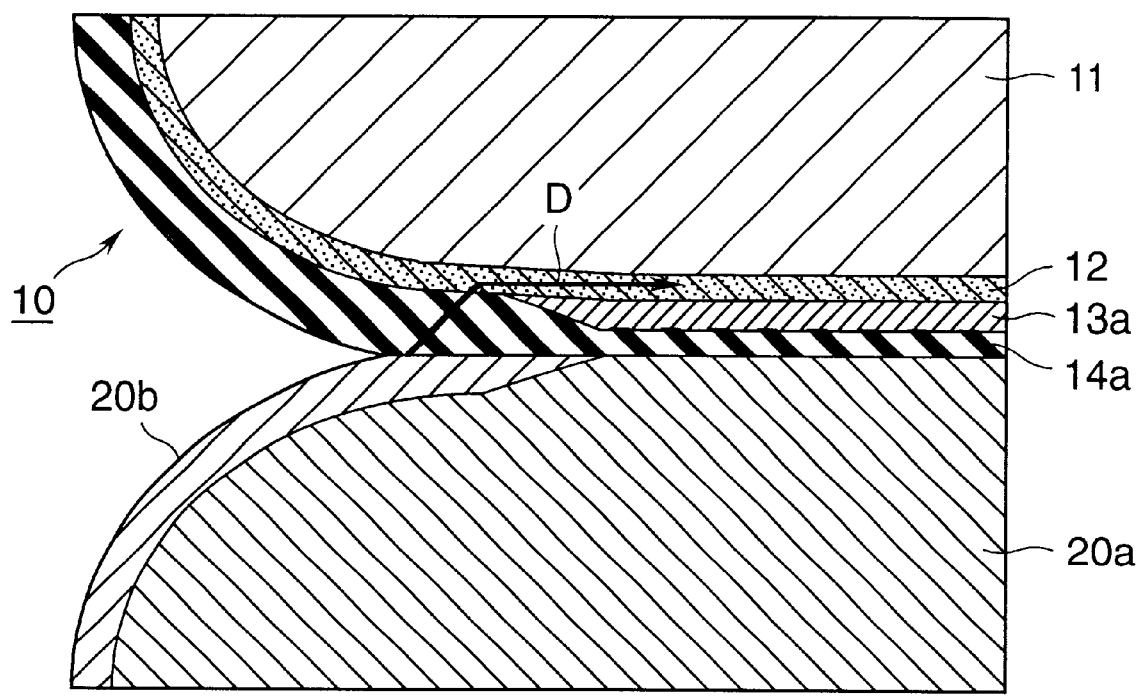

In the step shown in FIG. 3G, the bonded substrate stack shown in FIG. 3F is separated. FIG. 3G schematically shows the progress of separation of the bonded substrate stack shown in FIG. 3F. In the bonded substrate stack shown in FIG. 3F, the outer peripheral edge of the first layer 13a is located inside the outer peripheral edge of the bonding region. For this reason, separation starts from the bonding interface and reaches the porous layer 12 across the second layer 14a as an oxide layer. Even when the position of the outer peripheral edge of the first layer 13a substantially matches the position of the outer peripheral edge of the bonding region, separation starts from the bonding interface and reaches the porous layer 12 across the second layer 14a as an oxide layer.

Even when the outer peripheral portion of the first layer 13 is not completely oxidized, separation is likely to progress through the Si layer (first layer 13) instead of progressing along the interface between the $SiO_2$ layer (second layer 14a) and the Si layer (first layer 13) because the first layer 13 is thinned by oxidation. In this case as well, defects due to separation progress along the interface between the $SiO_2$ layer (second layer 14a) and the Si layer (first layer 13) are rarely generated. In this case, since the first layer 13 thinned by oxidation can be neglected, the outer peripheral edge of the first layer 13 can be regarded to substantially retreat toward the inside of the bonded substrate stack. That is, the present invention incorporates a case wherein the outer peripheral portion of the first layer 13 is not completely oxidized.

The above oxidation (FIG. 3F) may be performed for only a portion of the outer periphery of the bonded substrate stack after bonding (FIG. 3E) where separation should be started.

Even when the second layer 14 is formed, break of the first layer during separation can be prevented by making the outer peripheral edge of the first layer 13 retreat toward the inside of the bonded substrate stack (e.g., by about several mm from the outer peripheral edge of the bonded substrate stack). In this case, separation starts from the bonding interface and progresses to the porous layer through the side surface or outer peripheral edge of the first layer.

The bonded substrate stack is separated into two substrates at the porous layer by, e.g., 1) inserting a mechanical member such as a wedge near the bonding interface of the bonded substrate stack, 2) ejecting a gas (e.g., air, nitrogen, hydrogen, carbon dioxide, or an inert gas) or a liquid (e.g., water or an etchant), i.e., a fluid near the bonding interface of the bonded substrate stack (application of the water jet method), 3) applying a force such as pressure, tensile force, or shearing force to the bonded substrate stack, 4) expanding the porous layer from the outer peripheral portion in the oxidation process to apply a force to the pore walls in the porous layer, 5) applying pulsed heat to generate heat stress or softening the bonded substrate stack, or 6) applying an ultrasonic wave to break the porous layer. Another method may be used.

With the separation process, on the second substrate 20a side, a substrate (FIG. 3H) sequentially having a second layer ($SiO_2$ layer) 14b, first layer (Si layer) 13a, and porous layer 12a on the second substrate 20a is obtained.

Figure 3H:
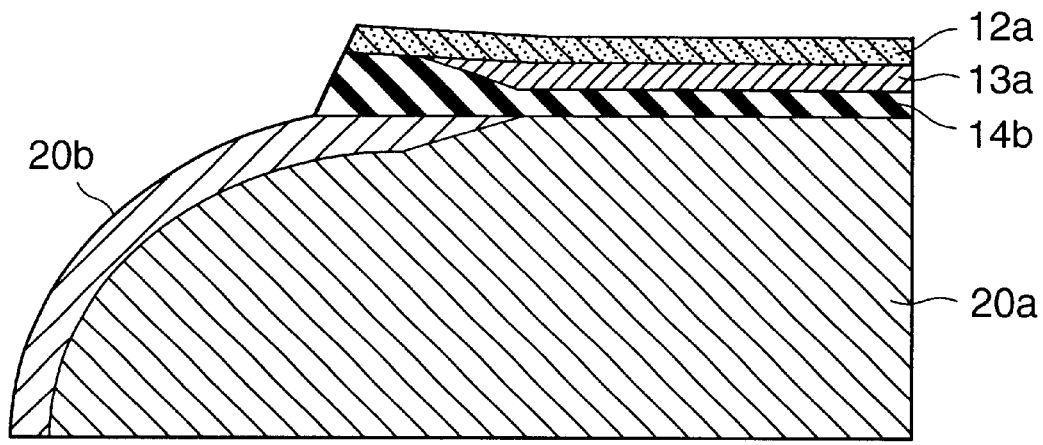
Figure 3I:
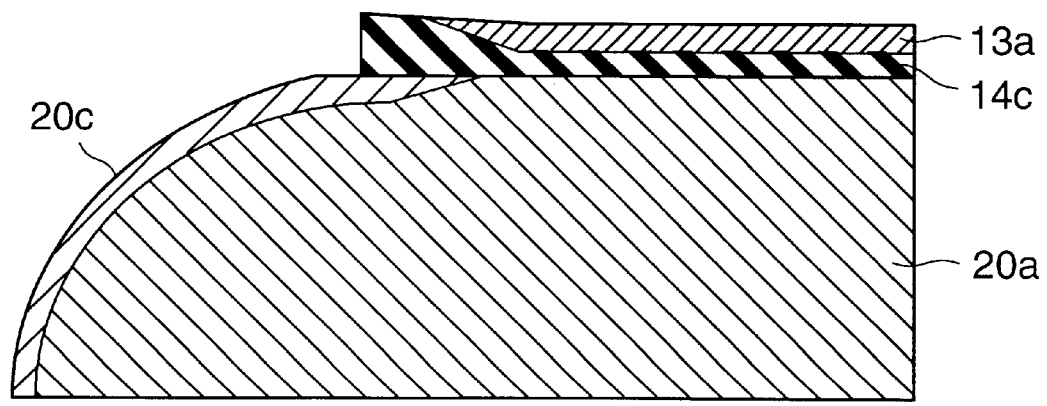

In the step shown in FIG. 3I, the porous layer 12a remaining on the uppermost layer of the substrate shown in FIG. 3H is selectively removed. As in this embodiment, when the first layer 13a is an Si layer, a normal etchant, for etching Si, hydrofluoric acid as an etchant for selectively etching porous Si, a solution mixture prepared by adding at least one of an alcohol and hydrogen peroxide to hydrofluoric acid, buffered hydrofluoric acid, or a solution mixture prepared by adding at least one of an alcohol and hydrogen peroxide to buffered hydrofluoric acid is preferably used to remove selectively remove the porous layer 12a. When the substrate having the second substrate 20a, second layer ($SiO_2$ layer) 14b, first layer (Si layer) 13a, and the porous layer 12a is etched using the etchant, a substrate (FIG. 3I) having the first layer (Si layer) 13a as the uppermost layer can be obtained. Reference numeral 14c denotes a second layer ($SiO_2$ layer) after etching; and 20c, an oxide film after etching.

Since the porous layer has a large surface area, the porous layer 12a can be selectively etched using a normal Si etchant, as described above.

Instead of removing the porous layer 12a using the etchant, the porous layer 12a may be selectively polished using the first layer (Si layer) 13a under the porous layer 12a as a polishing stopper.

Figure 3J:
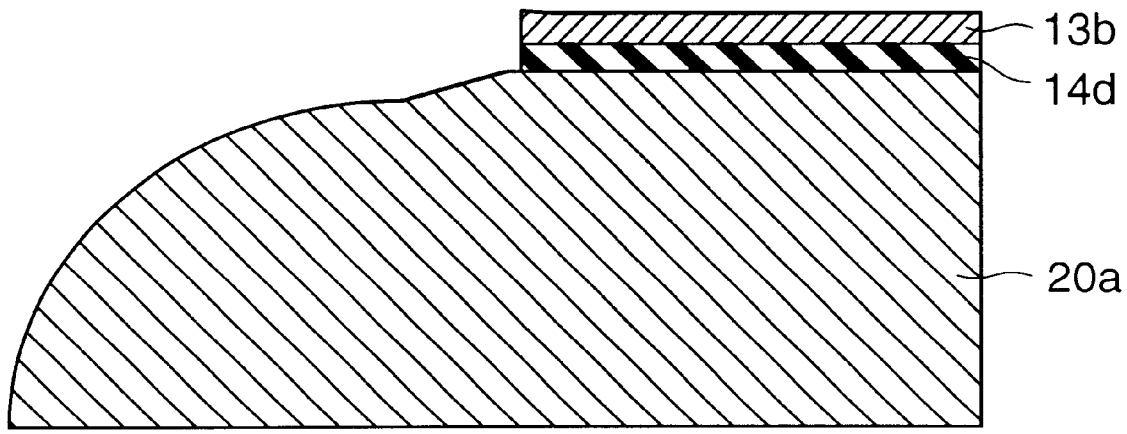

In the step shown in FIG. 3J, the oxide film 20c and second layer 14c at the outer peripheral portion of the substrate shown in FIG. 3I are removed by, e.g., etching. With this process, an SOI substrate sequentially having a second layer 14d and first layer 13b on the second substrate is obtained, as shown in FIG. 3J.

For the substrate on the first substrate 10 side, which is one of the two substrates separated by the separation process shown in FIG. 3G, the second film (SiO$_2$ layer) 14a and porous layer 12 remaining on the surface are removed. When a process of planarizing the surface is executed as needed, the substrate can be used again as a semiconductor substrate 11 or second substrate 20.

As described above, according to this embodiment, oxidation (FIG. 3F) is performed after bonding (FIG. 3E) to make at least part of the outer peripheral edge of the first layer 13 retreat toward the inside of the bonded substrate stack such that the outer peripheral edge is located at or inside the outer peripheral edge of the bonding region. With this structure, defects in the separation step can be prevented.

[Second Embodiment]

According to the method of this embodiment, a first substrate 10 having a first layer 13 only inside the outer peripheral portion (e.g., a portion separated from the outer peripheral edge by several mm) and a second layer 14 on the first layer 13 and its peripheral portion (including the side surface of the first layer) is prepared and bonded to a second substrate 20, thereby forming a bonded substrate stack. As a modification, the first substrate 10 having the first layer 13 only inside the outer peripheral portion may be prepared and bonded to the second substrate 20, and after this, the outer peripheral portion of the first layer may be oxidized.

FIGS. 4A to 4E are sectional views showing part of a semiconductor substrate manufacturing process according to the second embodiment of the present invention. FIGS. 4A to 4E show only part on the major surface side of the substrate, which corresponds to the portion 30 shown in FIG. 1C.

Figure 4A:
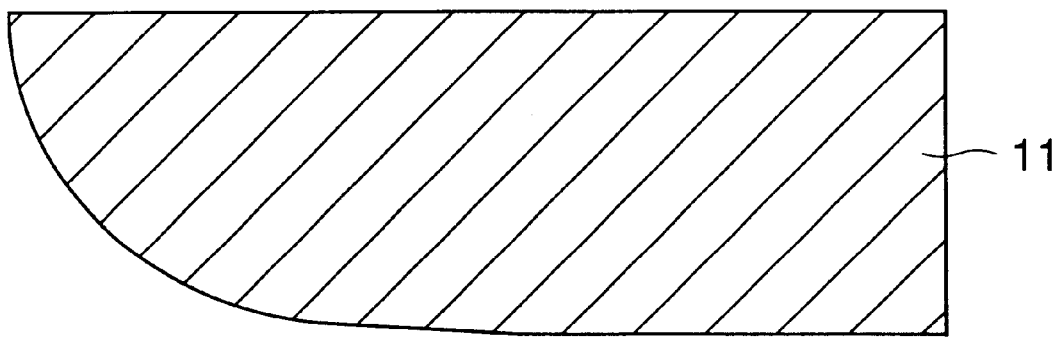
FIGS. 4A to 4E are sectional views showing part of a semiconductor substrate manufacturing process according to the second embodiment of the present invention.

Generally, a semiconductor substrate such as a single-crystal Si substrate is thinner at a portion separated from the outer peripheral edge by 1 to several mm than at the central portion because of polishing or etching even at the flat mirror surface portion inside the beveling portion, as shown in FIG. 4A.

Figure 4B:
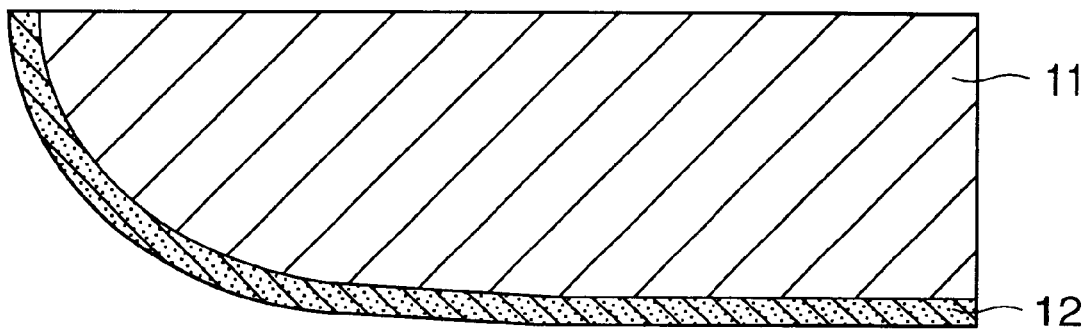

In the step shown in FIG. 4A, a semiconductor substrate 11 such as a single-crystal Si substrate is prepared. In the step shown in FIG. 4B, a porous layer 12 is formed on the major surface (mirror surface) side of the semiconductor substrate 11 by, e.g., anodizing. The region where the porous layer 12 is formed may extend to the outer peripheral edge or lower surface of the beveling portion of the semiconductor substrate 11, as shown in FIG. 4B, or may be smaller.

Figure 4C:
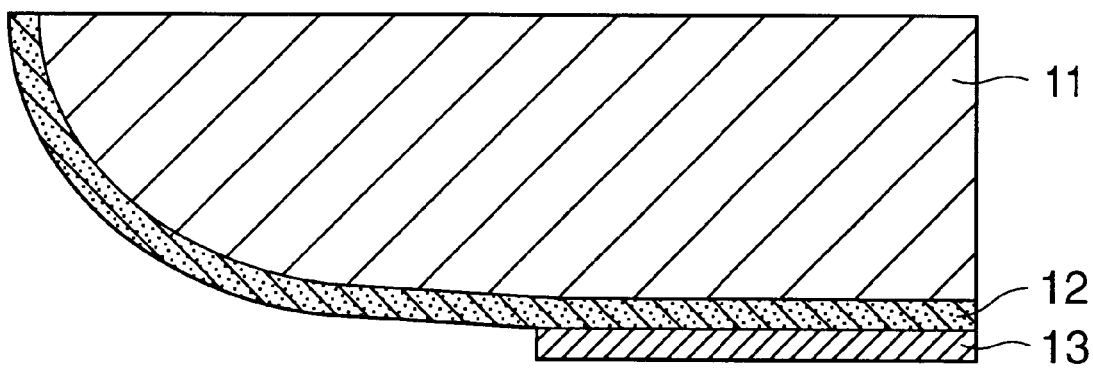

In the step shown in FIG. 4C, the first layer 13 is formed on the porous layer 12 only inside the outer peripheral portion (e.g., a portion separated from the outer peripheral edge by several mm) of the porous layer 12. To form the first layer 13 on the porous layer 12 only inside the outer peripheral portion of the porous layer 12, formation of the first layer 13 on the outer peripheral portion is impeded, or the first layer 13 is formed on the entire surface of the porous layer 12 and then patterned.

As an example of the former method, after a mask pattern that covers the outer peripheral portion of the porous layer 12 is formed, the single-crystal Si layer 13 is formed by epitaxial growth. After that, the mask pattern is removed.

As an example of the latter method, a resist film is formed on the first layer 13 and patterned to leave the resist film in a region other than the outer peripheral portion. The outer peripheral portion of the first layer 13 is etched using the remaining resist film as a mask pattern. At this time, the porous layer under the first layer 13 at the outer peripheral portion may be entirely or partially etched together.

As the first layer 13, for example, an Si layer such as a single-crystal Si layer, polysilicon layer, or amorphous Si layer, a metal film, a compound semiconductor layer, or a superconducting layer is preferable. As the first layer 13, an element such as a MOSFET may be formed.

Figure 4D:
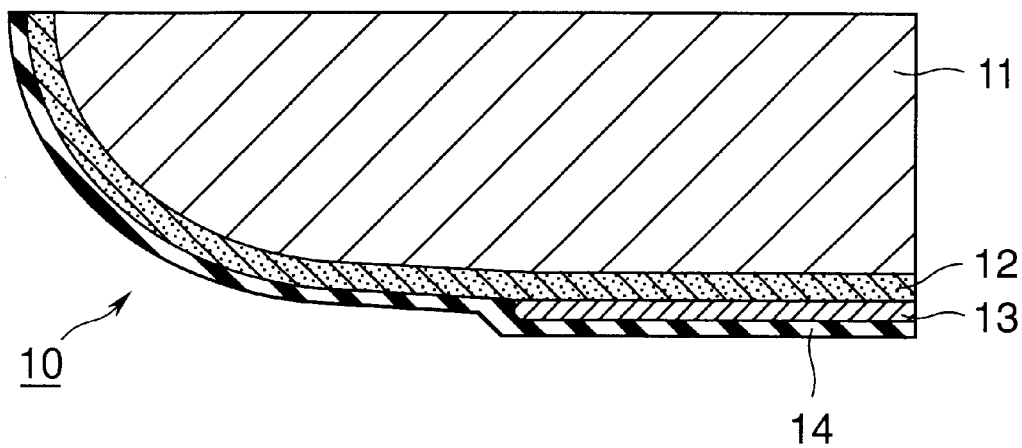

In the step shown in FIG. 4D, the second layer 14 is formed to cover the upper and side surfaces of the first layer 13. With this process, the first substrate 10 is obtained. As the second layer 14, an insulating layer such as an SiO$_2$ layer is preferable. When the first layer 13 is an Si layer, an SiO$_2$ layer formed by oxidizing (e.g., thermally oxidizing) the surface of the Si layer is preferable as the second layer 14. In the step shown in FIG. 4D, the second layer 14 may be formed on the upper surface of the first layer 13 and only on the side surface of the first layer 13 near the portion where separation starts.

Figure 4E:
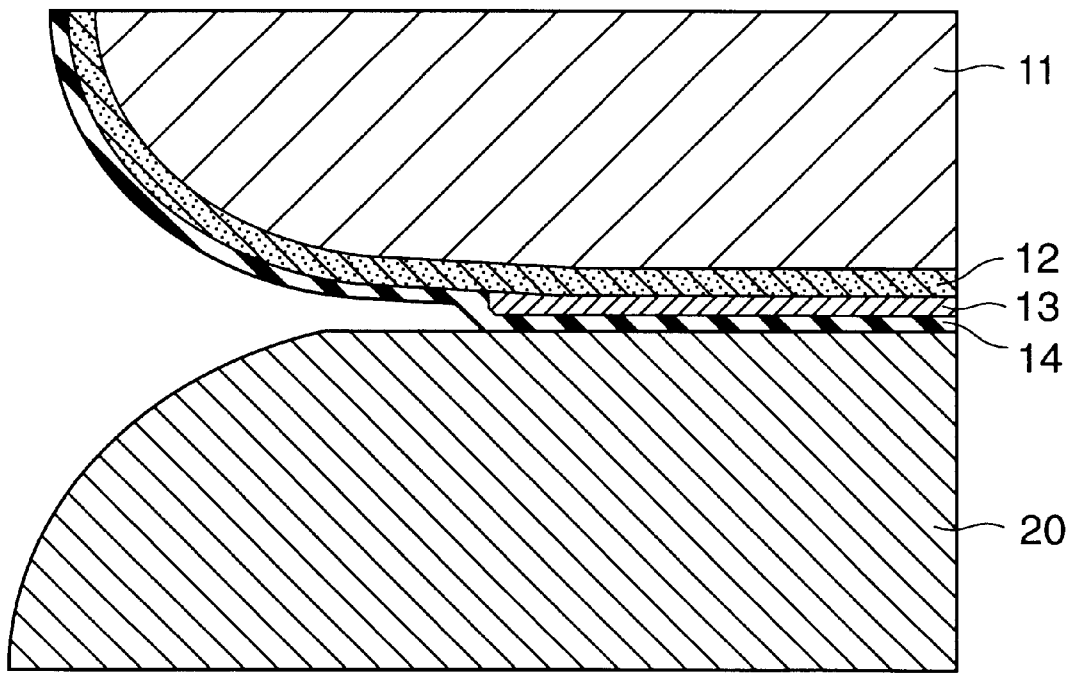

In the step shown in FIG. 4E, the major surface of the first substrate 10 and that of the second substrate 20 are brought into tight contact with each other at room temperature. After this, the first substrate 10 and second substrate 20 may be firmly bonded by anodic bonding, pressing, heating, or a combination thereof.

As the second substrate, an Si substrate, a substrate obtained by forming an insulating film on an Si substrate, an insulating substrate such as a quartz substrate, a transparent substrate such as a quartz substrate, or a sapphire substrate is preferable. However, the present invention is not limited to this, and any other substrate can be used as far as the surface to be bonded is sufficiently flat.

For example, when the second substrate 20 is an insulating substrate, or an insulating film is formed on the second substrate 20, the second layer 14 is not always necessary. However, when the second layer 14 is formed, the first layer 13 as an active layer can be apart from the bonding interface. When Si layers are to be bonded to each other to form a p-n diode, the second layer 14 is unnecessary.

A thin insulating plate may be inserted between the first substrate 10 and the second substrate 20 in bonding them.

With the above process, a bonded substrate stack in which at least part (a position where separation starts) of the outer peripheral edge of the first layer 13 is located inside the outer peripheral edge of the bonding region is obtained.

If the step shown in FIG. 4D is not performed, i.e., if the step of forming the second layer 14 is not performed, after the first substrate 10 (in this case, a substrate formed from the semiconductor substrate 11, porous layer 12, and first layer 13) and second substrate 20 are bonded to form a bonded substrate stack, another layer is preferably formed on the outer periphery side of the first layer 13. For example, when the first layer 13 is an Si layer, an SiO$_2$ layer is preferably formed on the outer periphery side of the first layer 13 by oxidizing the outer peripheral portion of the first layer 13. This structure prevents the single-crystal Si layer 13 from breaking during separation.

After the step shown in FIG. 4E, the steps shown in FIGS. 3G to 3J of the first embodiment are performed to obtain a semiconductor substrate such as an SOI substrate.

When a compound semiconductor layer is formed as the first layer 13, in the step corresponding to FIG. 3H, i.e., in the step of removing the porous layer remaining on the surface after separating the bonded substrate stack into two substrates, an etchant whose etching rate is higher for Si than for the material of the compound semiconductor layer is used to selectively etch the porous layer.

As described above, according to this embodiment, for example, when the first substrate 10 having the first layer 13 only inside the outer peripheral portion is prepared, the outer peripheral edge of the first layer 13 is located inside the outer peripheral edge of the bonding region. With this structure, defects in the separation step can be prevented.

[Third Embodiment]

In the method according to this embodiment, a first substrate having the first layer only inside the outer peripheral portion (e.g., a portion separated from the outer peripheral edge by several mm), and the second layer on the first layer is prepared and bonded to a second substrate. Preferably, the outer peripheral portion of the bonded substrate stack is oxidized to reduce the region of the first layer toward the inside of the bonded substrate stack such that the outer peripheral portion of the first layer is located inside the outer peripheral edge of the bonding region.

FIGS. 5A to 5G are sectional views showing part of a semiconductor substrate manufacturing process according to the third embodiment of the present invention. FIGS. 5A to 5G show only part on the major surface side of the substrate, which corresponds to the portion 30 shown in FIG. 1C.

Figure 5A:
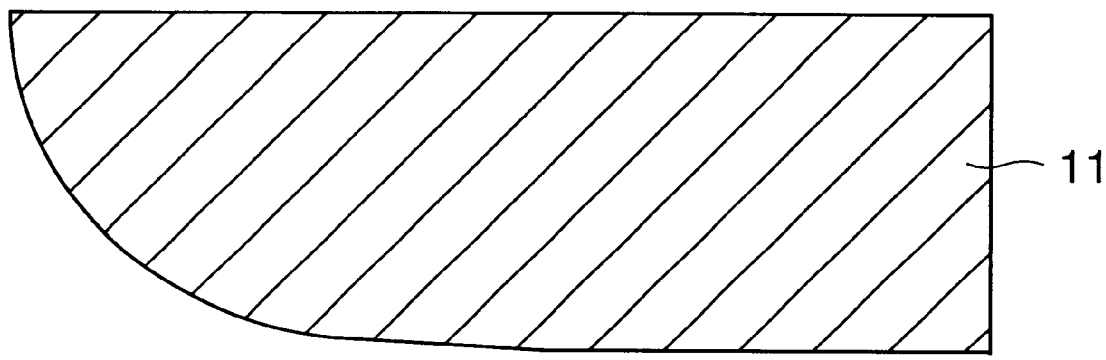
FIGS. 5A to 5G are sectional views showing part of a semiconductor substrate manufacturing process according to the third embodiment of the present invention.

Generally, a semiconductor substrate such as a single-crystal Si substrate is thinner at a portion separated from the outer peripheral edge by 1 to several mm than at the central portion because of polishing or etching even at the flat mirror surface portion inside the beveling portion, as shown in FIG. 5A.

Figure 5B:
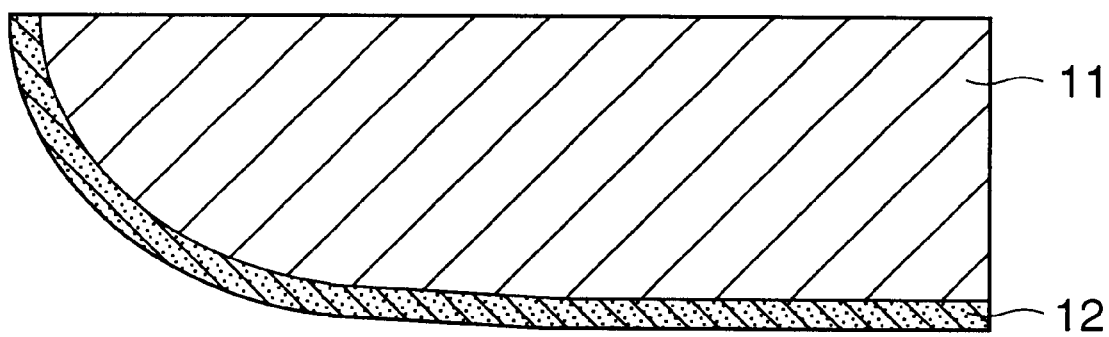

In the step shown in FIG. 5A, a semiconductor substrate 11 such as a single-crystal Si substrate is prepared. In the step shown in FIG. 5B, a porous layer 12 is formed on the major surface (mirror surface) side of the semiconductor substrate 11 by, e.g., anodizing. The region where the porous layer 12 is formed may extend to the outer peripheral edge or lower surface of the beveling portion of the semiconductor substrate 11, as shown in FIG. 5B, or may be smaller.

Figure 5C:
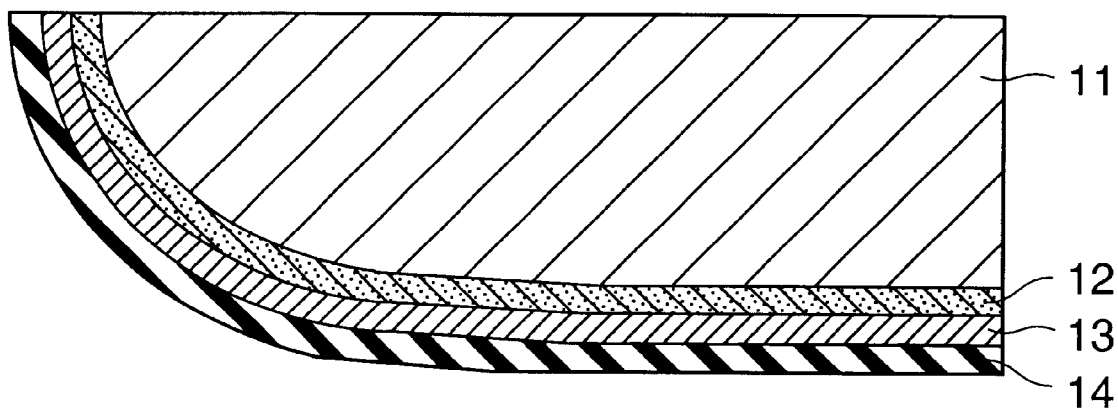

In the step shown in FIG. 5C, a first layer 13 and second layer 14 are formed on the porous layer 12. As the first layer 13, for example, an Si layer such as a single-crystal Si layer, polysilicon layer, or amorphous Si layer is preferable. As the first layer 13, an element such as a MOSFET may be formed. As the second layer 14, an oxide layer (e.g., an $SiO_2$ layer) formed by oxidizing (e.g., thermally oxidizing) the surface of the first layer (Si layer) 13 is preferable.

Figure 5D:
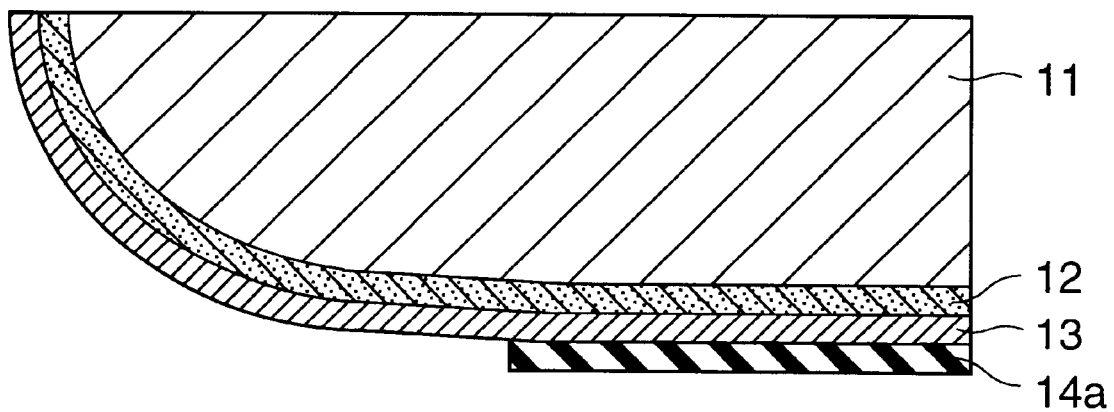

In the step shown in FIG. 5D, a mask pattern is formed on the second layer 14 shown in FIG. 5C to cover the central portion of the semiconductor substrate 11 while exposing the outer peripheral portion (e.g., a portion separated from the outer peripheral edge by several mm). Using this mask pattern, the outer peripheral portion of the second layer 14 is etched using an etchant such as buffered hydrofluoric acid to pattern the second layer 14. Reference numeral 14a denotes a patterned second layer.

Figure 5E:
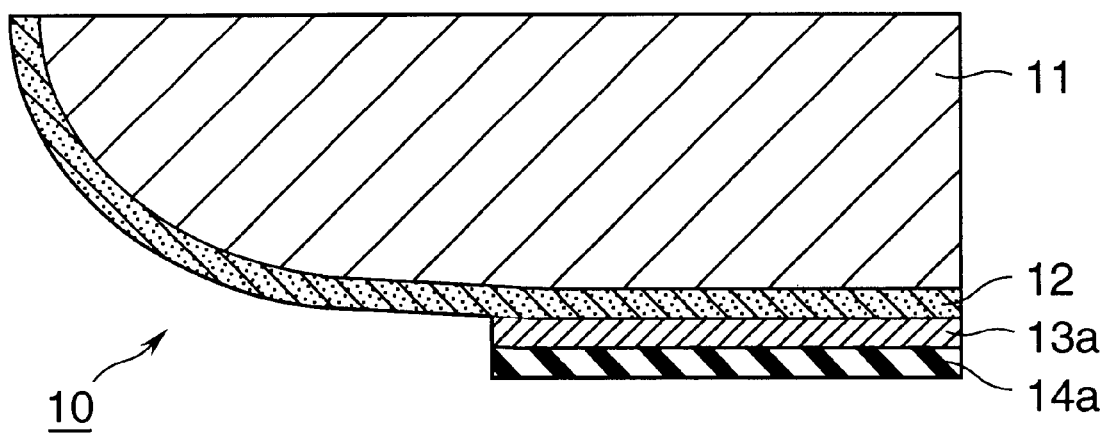

In the step shown in FIG. 5E, using the patterned second layer 14a as a mask pattern, the underlying first layer 13 is anisotropically etched by RIE (Reactive Ion Etching) and patterned. Reference numeral 13a denotes a patterned first layer. The mask pattern used to pattern a second layer 14 may be removed after the step shown in FIG. 5D or after the step shown in FIG. 5E. To prevent surface roughness of the second layer 14 due to etching, the mask pattern is preferably removed after the step shown in FIG. 5E.

With this process, the first substrate 10 having the first layer 13a and second layer 14a only inside the outer peripheral portion (e.g., a portion separated from the outer peripheral edge by several mm) can be formed.

Figure 5F:
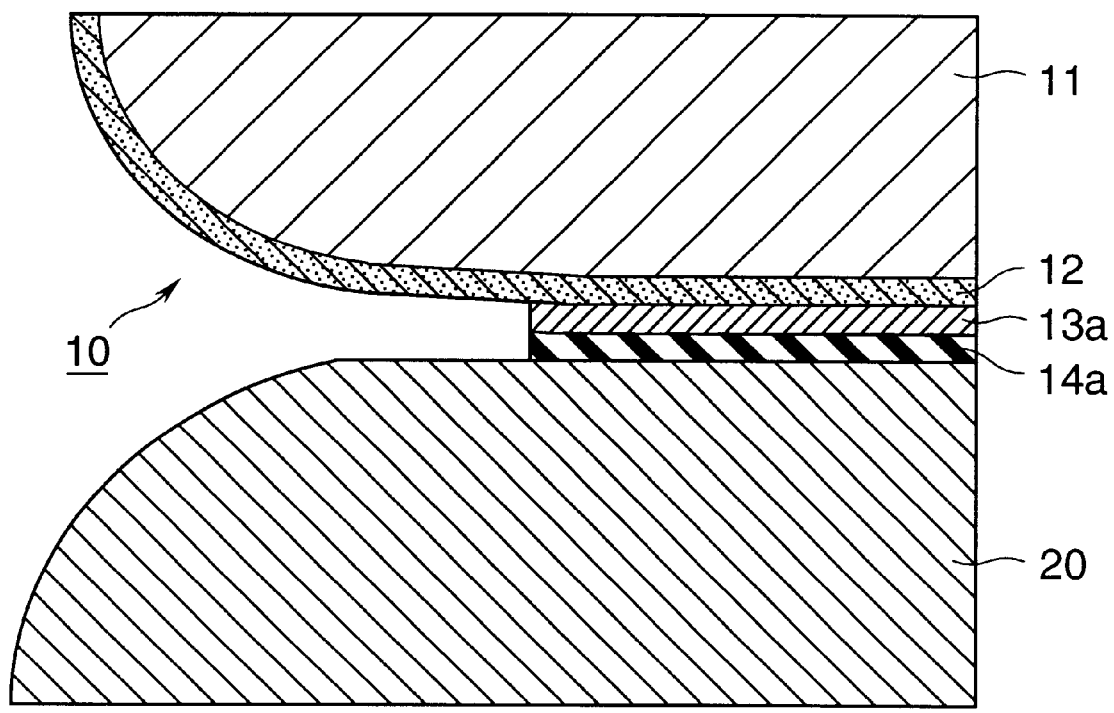

In the step shown in FIG. 5F, the major surface of the first substrate 10 and that of a second substrate 20 are brought into tight contact with each other at room temperature. After this, the first substrate 10 and second substrate 20 may be firmly bonded by anodic bonding, pressing, heating, or a combination thereof.

As the second substrate, an Si substrate, a substrate obtained by forming an insulating film on an Si substrate, an insulating substrate such as a quartz substrate, a transparent substrate such as a quartz substrate, or a sapphire substrate is preferable. However, the present invention is not limited to this, and any other substrate can be used as far as the surface to be bonded is sufficiently flat.

For example, when the second substrate 20 is an insulating substrate, or an insulating film is formed on the second substrate 20, the second layer 14a is not always necessary. However, when the second layer 14a is formed, the first layer 13 as an active layer can be apart from the bonding interface. When Si layers are to be bonded to each other to form a p-n diode, the second layer 14a is unnecessary.

A thin insulating plate may be inserted between the first substrate 10 and the second substrate 20 in bonding them.

With the above process, a bonded substrate stack in which the position of the outer peripheral edge of the first layer matches the position of the outer peripheral edge of the bonding region can be prepared. When the position of the outer peripheral edge of the first layer matches the position of the outer peripheral edge of the bonding region, defects in the separation step can be effectively prevented. The following process is preferably further executed.

Figure 5G:
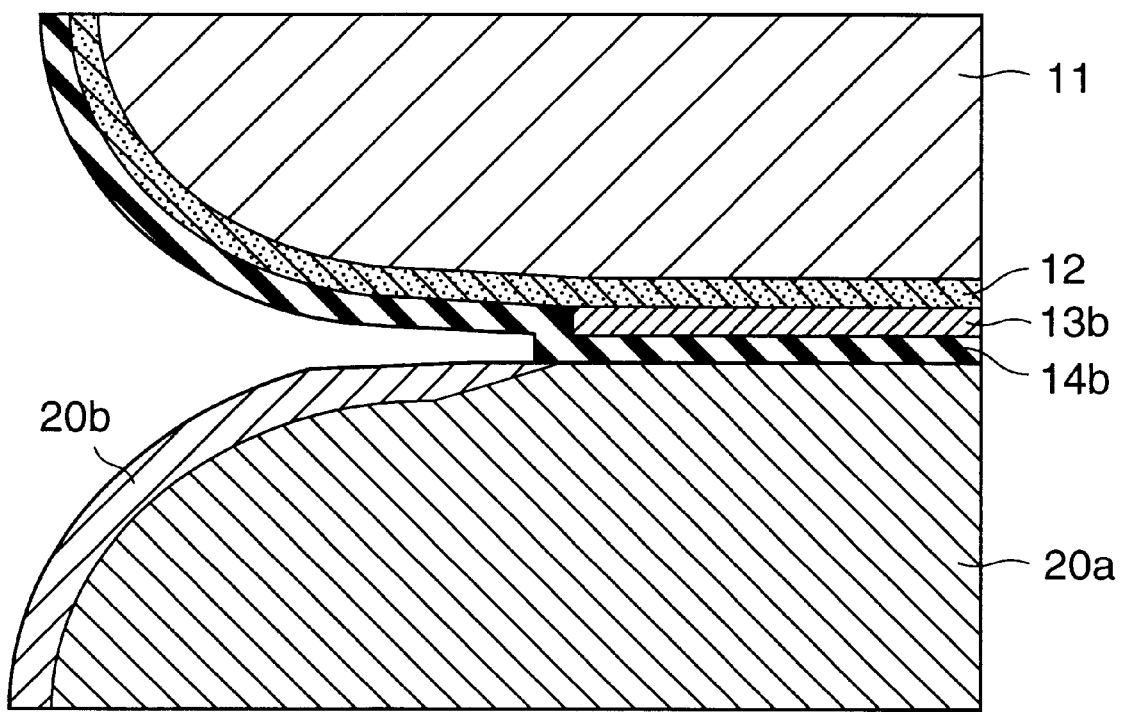

In the step shown in FIG. 5G, the edge portion of the bonded substrate stack shown in FIG. 5F is oxidized (e.g., thermally oxidized). In the example shown in FIG. 5F, the first layer 13 is an Si layer such as a single-crystal Si layer, the second layer 14 is an $SiO_2$ layer, and the second substrate 20 is an Si substrate such as a single-crystal Si substrate.

In the example shown in FIG. 5G, since the outer peripheral portion of the first layer 13a is oxidized, the region of the first layer 13a reduces toward the inside of the bonded substrate stack. Reference numeral 13b denotes a first layer after oxidation; 14b, a second layer after oxidation; 20a, a second substrate after oxidation; and 20b, an oxide film formed on the second substrate 20a by oxidation.

With this oxidation, a bonded substrate stack in which the outer peripheral portion of the first layer 13b is located inside the outer peripheral portion of the bonding region is obtained.

After the step shown in FIG. 5F, the steps shown in FIGS. 3G to 3J of the first embodiment are performed to obtain a semiconductor substrate such as an SOI substrate.

As described above, according to this embodiment, the first substrate 10 having the first layer only inside the outer peripheral portion and the second layer only on the first layer is prepared and bonded to the second substrate to form a bonded substrate stack in which the position of the outer peripheral edge of the first layer matches the outer peripheral edge of the bonding region. With this structure, defects in the separation step can be prevented.

When the bonded substrate stack is oxidized to locate the outer peripheral edge of the first layer inside the outer peripheral edge of the bonding region, defects in the separation step can be more effectively prevented.

[Fourth Embodiment]

In the method according to this embodiment, after a bonded substrate stack is formed by bonding a first substrate 10 having a first layer to a second substrate 20, the outer peripheral portion of the first layer is removed to locate the outer peripheral edge of the first layer inside that of the bonding region.

FIGS. 6A to 6G are sectional views showing part of a semiconductor substrate manufacturing process according to the fourth embodiment of the present invention. FIGS. 6A to 6G show only part on the major surface side of the substrate, which corresponds to the portion 30 shown in FIG. 1C.

Figure 6A:
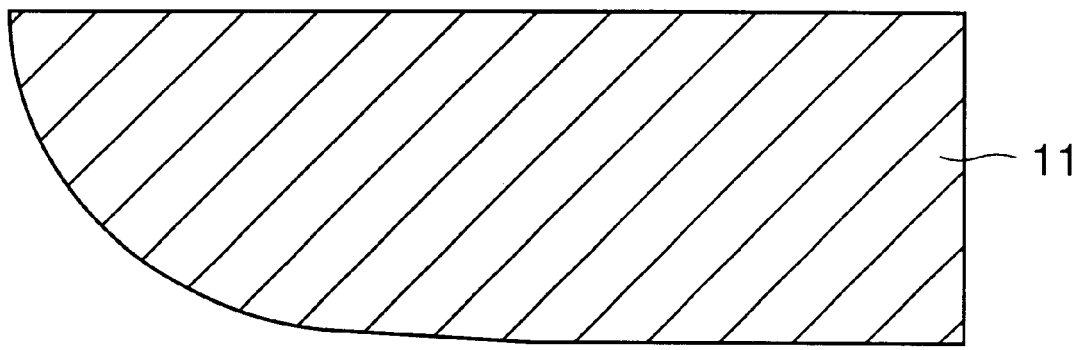
FIGS. 6A to 6G are sectional views showing part of a semiconductor substrate manufacturing process according to the fourth embodiment of the present invention.

Generally, a semiconductor substrate such as a single-crystal Si substrate is thinner at a portion separated from the outer peripheral edge by 1 to several mm than at the central portion because of polishing or etching even at the flat mirror surface portion inside the beveling portion, as shown in FIG. 6A.

Figure 6B:
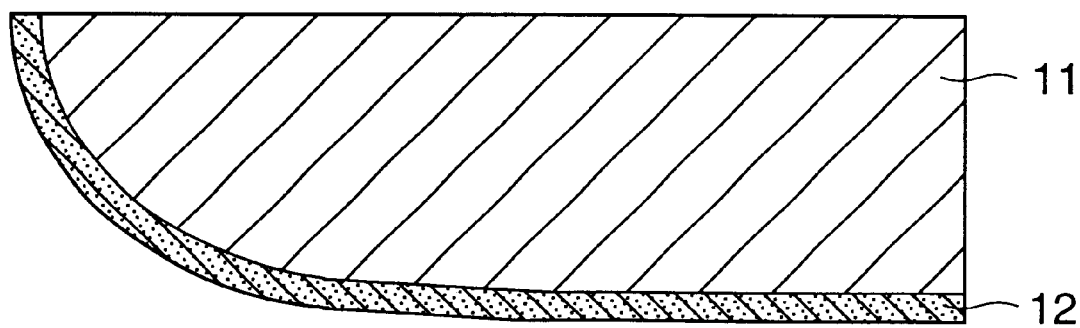

In the step shown in FIG. 6A, a semiconductor substrate 11 such as a single-crystal Si substrate is prepared. In the step shown in FIG. 6B, a porous layer 12 is formed on the major surface (mirror surface) side of the semiconductor substrate 11 by, e.g., anodizing. The region where the porous layer 12 is formed may extend to the outer peripheral edge or lower surface of the beveling portion of the semiconductor substrate 11, as shown in FIG. 6B, or may be smaller.

Figure 6C:
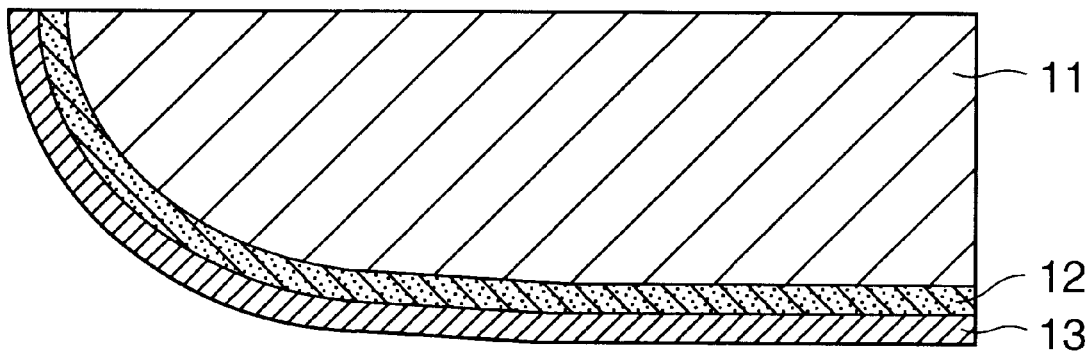

In the step shown in FIG. 6C, a first layer 13 is formed on the porous layer 12. As the first layer 13, for example, an Si layer such as a single-crystal Si layer, polysilicon layer, or amorphous Si layer, a metal film, a compound semiconductor layer, or a superconducting layer is preferable. As the first layer 13, an element such as a MOSFET may be formed.

Figure 6D:
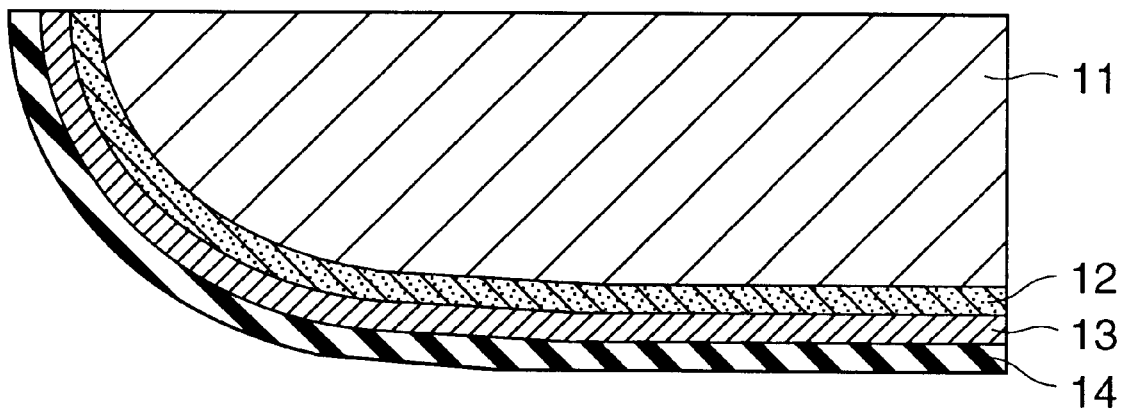

In the step shown in FIG. 6D, a second layer 14 is formed on the first layer 13. With this process, the first substrate 10 is obtained. As the second layer 14, an insulating layer such as an $SiO_2$ layer is preferable. When the first layer 13 is an Si layer, an $SiO_2$ layer formed by oxidizing (e.g., thermally oxidizing) the surface of the Si layer is preferable as the second layer 14.

Figure 6E:
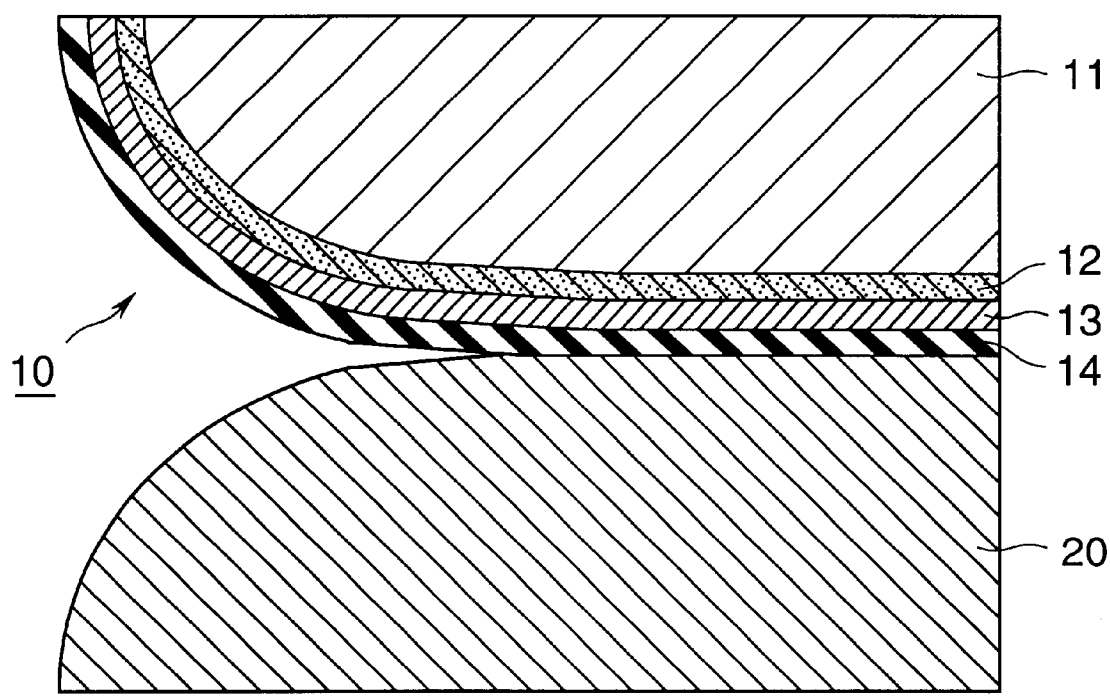

In the step shown in FIG. 6E, the major surface of the first substrate 10 and that of a second substrate 20 are brought into tight contact with each other at room temperature. After this, the first substrate 10 and second substrate 20 may be firmly bonded by anodic bonding, pressing, heating, or a combination thereof.

As the second substrate, an Si substrate, a substrate obtained by forming an insulating film on an Si substrate, an insulating substrate such as a quartz substrate, a transparent substrate such as a quartz substrate, or a sapphire substrate is preferable. However, the present invention is not limited to this, and any other substrate can be used as far as the surface to be bonded is sufficiently flat.

For example, when the second substrate 20 is an insulating substrate, or an insulating film is formed on the second substrate 20, the second layer 14 is not always necessary. However, when the second layer 14 is formed, the first layer 13 as an active layer can be apart from the bonding interface. When Si layers are to be bonded to each other to form a p-n diode, the second layer 14 is unnecessary.

A thin insulating plate may be inserted between the first substrate 10 and the second substrate 20 in bonding them.

Figure 6F:
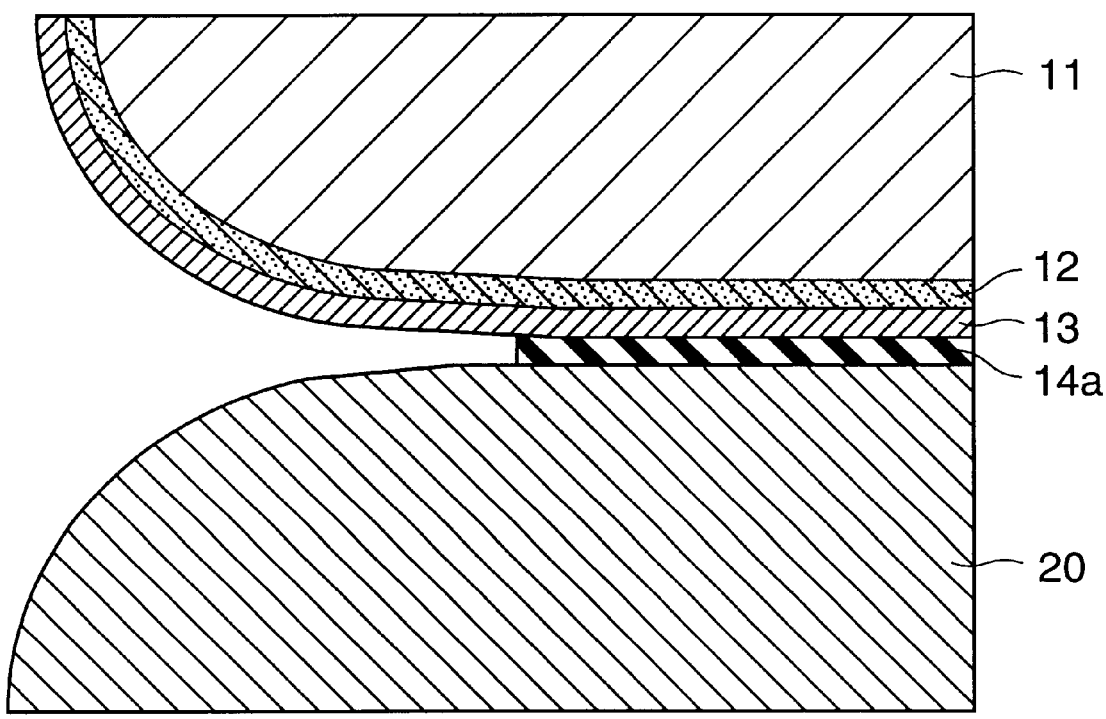

In the step shown in FIG. 6F, the outer peripheral portion (e.g., a portion separated from the outer peripheral edge by several mm) of the second layer 14 is removed and simultaneously the first layer 13 is exposed by etching. Reference numeral 14a denotes a second layer after etching.

Figure 6G:
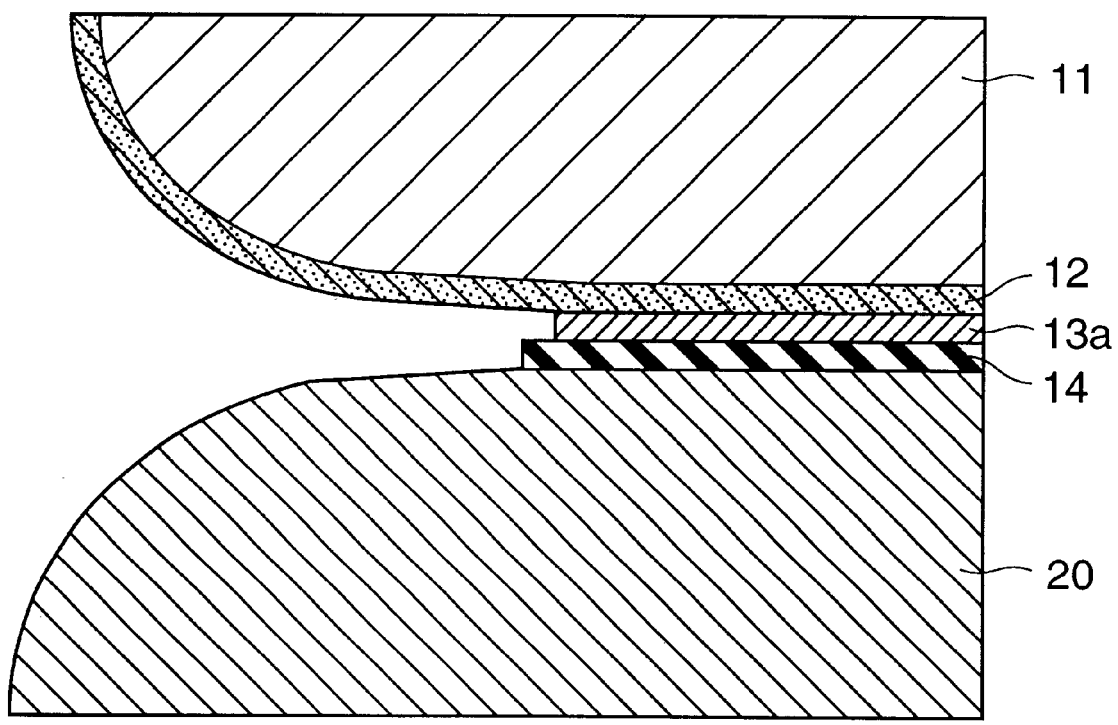

In the step shown in FIG. 6G, the outer peripheral portion of the first layer 13 is removed by etching to locate the outer peripheral edge of a first layer 13a after etching at or inside the outer peripheral edge (i.e., the outer peripheral edge of the bonding region of the second layer 14a.

With the above process, a bonded substrate stack in which the outer peripheral edge of the first layer 13 is located at or inside the outer peripheral edge of the bonding region is obtained.

After the step shown in FIG. 6G, the steps shown in FIGS. 3G to 3J of the first embodiment are performed to obtain a semiconductor substrate such as an SOI substrate.

[Fifth Embodiment]

This embodiment is related to a modification of the first, third, and fourth embodiments. More specifically, in this embodiment, ions are implanted into a semiconductor substrate such as a single-crystal Si substrate to form a porous layer (microcavity layer) at a predetermined depth in the single-crystal Si substrate.

This embodiment replaces the steps shown in FIGS. 3A to 3D of the first embodiment, the steps shown in FIGS. 5A to 5C of the third embodiment, and the steps shown in FIGS. 6A to 6D of the fourth embodiment with the following steps.

In the method according to this embodiment, a single-crystal Si substrate 11 is prepared, and the surface of this substrate is oxidized to form a second layer 14. After this, hydrogen ions, helium ions, or inert gas ions are implanted into the single-crystal Si substrate 11 to form a porous layer (microcavity layer) 12 at a predetermined depth in the single-crystal Si substrate 11. With this process, a first substrate 10 having a single-crystal Si layer as a first layer 13 under the second layer 14, and the porous layer 12 under the first layer 13 is formed. As the single-crystal Si substrate, a substrate having an epitaxial layer on its surface, a substrate with its surface annealed in an H atmosphere, or an FZ substrate can be employed. When a substrate having an epitaxial layer on its surface is employed as the single-crystal Si substrate, the first layer 13 is entirely or partially (a portion on the second layer 14 side) formed from the epitaxial layer.

The acceleration energy for the ions to be implanted is set such that the projection range matches the implantation depth. The size or density of resultant microcavities changes depending on the dose of ions. The dose is preferably about $1 \times 10^{15}/cm^2$ or more, and more preferably, $1 \times 10^{16}$ to $1 \times 10^{17}/cm^2$. To increase the ion implantation depth (projection range), channeling ion implantation may be employed.

EXAMPLES

Specific examples or the above embodiments will be described below.

Example 1

Example 1 provides a specific example of the first embodiment.

First, a single-crystal Si substrate 11 used to form a first substrate 10 was prepared (FIG. 3A). The single-crystal Si substrate 11 was anodized in an HF solution to form a porous layer 12 on the surface (FIG. 3B). The anodizing conditions were as follows.

<Anodizing Conditions>

Current density: 7 ($mA/cm^2$)

Anodizing solution: HF: $H_2O$: $C_2H_5OH$=1:1:1

Process time: 11 (min)

Porous Si thickness: 12 ($\mu m$)

A 0.15-$\mu m$ thick single-crystal Si layer 13 was epitaxially grown on the porous Si layer 12 by CVD (Chemical Vapor Deposition) (FIG. 3C). The growth conditions were as follows. At the early stage of epitaxial growth, the surface of the porous Si layer 12 was exposed to $H_2$. Hence, holes on the surface were filled to form a flat surface.

<Epitaxial Growth Conditions>

Source gas: $SiH_2Cl_2/H_2$

Gas flow rate: 0.5/180 (l/min)

Gas pressure: 80 (Torr)

Temperature: 950 (° C.)

Growth rate: 0.3 ($\mu m$/min)

A 100-nm thick $SiO_2$ layer 14 was formed on the surface of the epitaxially grown single-crystal Si layer 13 by thermal oxidation (FIG. 3D).

The surface of the SiO$_2$ layer 14 and that of an independently prepared Si substrate (second substrate) 20 were brought into tight contact with each other (FIG. 3E). After that, annealing including thermal oxidation was performed at 1,000° C. for 2 hrs (FIG. 3F).

With this thermal oxidation, the outer peripheral portion of the single-crystal Si layer (first layer) was oxidized, and the outer peripheral edge retreated inside the bonded substrate stack. Hence, a bonded substrate stack in which the outer peripheral edge of the single-crystal Si layer (first layer) was located inside the outer peripheral edge of the bonding region between the first substrate 10 and the second substrate 20 was obtained.

The above process may be executed such that the outer peripheral edge of a single-crystal Si layer 13a is located inside the outer peripheral edge of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but a polysilicon layer or amorphous Si layer may be formed.

Example 2

Example 2 provides another specific example of the first embodiment. In Example 2, a porous layer 12 having a two-layered structure formed from two porous layers having different porosities was formed.

First, a single-crystal Si substrate 11 used to form a first substrate 10 was prepared (FIG. 3A). The single-crystal Si substrate 11 was anodized in two steps in an HF solution to form a porous layer having a two-layered structure on the surface (FIG. 3B). The anodizing conditions were as follows.

<First Anodizing Conditions>
Current density: 7 (mA/cm$^2$)
Anodizing solution: HF: H$_2$O: C$_2$H$_5$OH=1:1:1
Process time: 11 (min)
Porous Si thickness: 12 ($\mu$m)
<Second Anodizing Conditions>
Current density: 21 (mA/cm$^2$)
Anodizing solution: HF: H$_2$O: C$_2$H$_5$OH=1:1:1
Process time: 2 (min)
Porous Si thickness: 3 ($\mu$m)

A 0.15-$\mu$m thick single-crystal Si layer 13 was epitaxially grown on the porous Si layer 12 by CVD (Chemical Vapor Deposition) (FIG. 3C). The growth conditions were as follows. At the early stage of epitaxial growth, the surface of the porous Si layer 12 was exposed to H$_2$. Hence, holes on the surface were filled to form a flat surface.
<Epitaxial Growth Conditions>
Source gas: SiH$_2$Cl$_2$/H$_2$
Gas flow rate: 0.5/180 (l/min)
Gas pressure: 80 (Torr)
Temperature: 950 (° C.)
Growth rate: 0.3 ($\mu$m/min)

A 100-nm thick SiO$_2$ layer 14 was formed on the surface of the epitaxially grown single-crystal Si layer 13 by thermal oxidation (FIG. 3D).

The surface of the SiO$_2$ layer 14 and that of an independently prepared Si substrate (second substrate) 20 were brought into tight contact with each other (FIG. 3E). After that, annealing including thermal oxidation was performed at 1,000° C. for 2 hrs (FIG. 3F).

With this thermal oxidation, the outer peripheral portion of the single-crystal Si layer (first layer) was oxidized, and the outer peripheral edge retreated toward the inside. Hence, a bonded substrate stack in which the outer peripheral edge of the single-crystal Si layer (first layer) 13 was located inside the outer peripheral edge of the bonding region between the first substrate 10 and the second substrate 20 was obtained.

The above process may be executed such that the outer peripheral edge of a single-crystal Si layer 13a is located inside the outer peripheral edge of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but a polysilicon layer or amorphous Si layer may be formed.

Example 3

Example 3 provides still another specific example of the first embodiment. In Example 3, a porous layer 12 having a multilayered structure formed from a puerility of porous layers having different porosities was formed.

First, a single-crystal Si substrate 11 used to form a first substrate 10 was prepared (FIG. 3A). The single-crystal Si substrate 11 was anodized in three steps in an HF solution to form a porous layer having a three-layered structure on the surface (FIG. 3B). The anodizing conditions were as follows.

<First Anodizing Conditions>
Current density: 7 (mA/cm$^2$)
Anodizing solution: HF: H$_2$O: C$_2$H$_5$OH=1:1:1
Process time: 11 (min)
Porous Si thickness: 12 ($\mu$m)
<Second Anodizing Conditions>
Current density: 21 (mA/cm$^2$)
Anodizing solution: HF: H$_2$O: C$_2$H$_5$OH=1:1:1
Process time: 2 (min)
Porous Si thickness: 3 ($\mu$m)
<Third Anodizing Conditions>
Current density: 7 (mA/cm$^2$)
Anodizing solution: HF: H$_2$O: C$_2$H$_5$OH=1:1:1
Process time: 2 (min)
Porous Si thickness: 2 ($\mu$m)

A 0.3-$\mu$m thick single-crystal Si layer 13 was epitaxially grown on the porous Si layer 12 by CVD (Chemical Vapor Deposition) (FIG. 3C) The growth conditions were as follows. At the early stage of epitaxial growth, the surface of the porous Si layer 12 was exposed to H$_2$. Hence, holes on the surface were filled to form a flat surface.
<Epitaxial Growth Conditions>
Source gas: SiH$_2$Cl$_2$/H$_2$
Gas flow rate: 0.5/180 (l/min)
Gas pressure: 80 (Torr)
Temperature: 950 (° C.)
Growth rate: 0.3 ($\mu$m/min)

A 200-nm thick SiO$_2$ layer 14 was formed on the surface of the epitaxially grown single-crystal Si layer 13 by thermal oxidation (FIG. 3D).

The surface of the SiO$_2$ layer 14 and that of an independently prepared Si substrate (second substrate) 20 were brought into tight contact with each other (FIG. 3E). After that, annealing including thermal oxidation was performed at 1,000° C. for 2 hrs (FIG. 3F).

With this thermal oxidation, the outer peripheral portion of the single-crystal Si layer (first layer) was oxidized, and the outer peripheral edge retreated toward the inside. Hence, a bonded substrate stack in which the outer peripheral edge of the single-crystal Si layer (first layer) was located inside the outer peripheral edge of the bonding region between the first substrate 10 and the second substrate 20 was obtained.

The above process may be executed such that the outer peripheral edge of a single-crystal Si layer 13*a* is located inside the outer peripheral edge of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but a polysilicon layer or amorphous Si layer may be formed.

Example 4

Example 4 provides still another specific example of the first embodiment. In Example 4, a porous layer 12 having a two-layered structure formed from two porous layers having different porosities was formed.

First, a single-crystal Si substrate 11 used to form a first substrate 10 was prepared (FIG. 3A). The single-crystal Si substrate 11 was anodized in two steps in an HF solution to form a porous layer having a two-layered structure on the surface (FIG. 3B). The anodizing conditions were as follows.
<First Anodizing Conditions>
   Current density: 7 (mA/cm$^2$)
   Anodizing solution: HF: $H_2O$: $C_2H_5OH$=1:1:1
   Process time: 5 (min)
   Porous Si thickness: 5.5 ($\mu$m)
<Second Anodizing Conditions>
   Current density: 30 (mA/cm$^2$)
   Anodizing solution: HF: $H_2O$: $C_2H_5OH$=1:1:1
   Process time: 1.3 (min)
   Porous Si thickness: 3 ($\mu$m)

A 0.15-$\mu$m thick single-crystal Si layer 13 was epitaxially grown on the porous Si layer 12 by CVD (Chemical Vapor Deposition) (FIG. 3C). The growth conditions were as follows. At the early stage of epitaxial growth, the surface of the porous Si layer 12 was exposed to $H_2$. Hence, holes on the surface were filled to form a flat surface.
<Epitaxial Growth Conditions>
   Source gas: $SiH_2Cl_2/H_2$
   Gas flow rate: 0.5/180 (l/min)
   Gas pressure: 80 (Torr)
   Temperature: 950 (° C.)
   Growth rate: 0.3 ($\mu$m/min)

A 100-nm thick $SiO_2$ layer 14 was formed on the surface of the epitaxially grown single-crystal Si layer 13 by thermal oxidation (FIG. 3D).

The surface of the $SiO_2$ layer and that of an independently prepared Si substrate (second substrate) 20 having a 400-nm thick oxide film on its surface were subjected to surface activation using a nitrogen plasma, and then cleaned. After that, the surfaces of the two substrates were brought into tight contact with each other (FIG. 3E).

Next, annealing including thermal oxidation was performed at 1,000° C. for 2 hrs (FIG. 3F).

With this thermal oxidation, the outer peripheral portion of the single-crystal Si layer (first layer) was oxidized, and the outer peripheral edge retreated toward the inside. Hence, a bonded substrate stack in which the outer peripheral edge of the single-crystal Si layer (first layer) was located inside the outer peripheral edge of the bonding region between the first substrate 10 and the second substrate 20 was obtained.

The above process may be executed such that the outer peripheral edge of a single-crystal Si layer 13*a* is located inside the outer peripheral edge of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but a polysilicon layer or amorphous Si layer may be formed.

Example 5

Example 5 provides still another specific example of the first embodiment. In Example 5, a porous layer 12 having a two-layered structure formed from two porous layers having different porosities was formed.

First, a single-crystal Si substrate 11 used to form a first substrate 10 was prepared (FIG. 3A). The single-crystal Si substrate 11 was anodized in two steps in an HF solution to form a porous layer having a two-layered structure on the surface (FIG. 3B). The anodizing conditions were as follows.
<First Anodizing Conditions>
   Current density: 7 (mA/cm$^2$)
   Anodizing solution: HF: $H_2O$: $C_2H_5OH$=1:1:1
   Process time: 11 (min)
   Porous Si thickness: 12 ($\mu$m)
<Second Anodizing Conditions>
   Current density: 21 (mA/cm$^2$)
   Anodizing solution: HF: $H_2O$: $C_2H_5OH$=1:1:1
   Process time: 2 (min)
   Porous Si thickness: 3 ($\mu$m)

A 0.15-$\mu$m thick single-crystal Si layer 13 was epitaxially grown on the porous Si layer 12 by CVD (Chemical Vapor Deposition) (FIG. 3C). The growth conditions were as follows. At the early stage of epitaxial growth, the surface of the porous Si layer 12 was exposed to $H_2$. Hence, holes on the surface were filled to form a flat surface.
<Epitaxial Growth Conditions>
   Source gas: $SiH_2Cl_2/H_2$
   Gas flow rate: 0.5/180 (l/min)
   Gas pressure: 80 (Torr)
   Temperature: 950 (° C.)
   Growth rate: 0.3 ($\mu$m/min)

A 100-nm thick $SiO_2$ layer 14 was formed on the surface of the epitaxially grown single-crystal Si layer 13 by thermal oxidation (FIG. 3D).

The surface of the $SiO_2$ layer and that of an independently prepared quartz substrate or glass substrate (second substrate) 20 were subjected to surface activation using a nitrogen plasma, and then cleaned. After that, the surfaces of the two substrates were brought into tight contact with each other (FIG. 3E). As the second substrate 20, for example, a sapphire substrate may be employed.

Next, pyro-oxidation was performed for the substrates at 900° C. for 360 min (FIG. 3F)

With this pyro-oxidation, the outer peripheral portion of the single-crystal Si layer (first layer) was oxidized, and the outer peripheral edge retreated toward the inside. Hence, a bonded substrate stack in which the outer peripheral edge of the single-crystal Si layer (first layer) was located inside the outer peripheral edge of the bonding region between the first substrate 10 and the second substrate 20 was obtained.

The above process may be executed such that the outer peripheral edge of a single-crystal Si layer 13a is located inside the outer peripheral edge of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but a polysilicon layer or amorphous Si layer may be formed.

Example 6

Example 6 provides still another specific example of the first embodiment. In Example 6, a porous layer 12 having a two-layered structure formed from two porous layers having different porosities was formed.

First, a single-crystal Si substrate 11 used to form a first substrate 10 was prepared (FIG. 3A). The single-crystal Si substrate 11 was anodized in two steps in an HF solution to form a porous layer having a two-layered structure on the surface (FIG. 3B). The anodizing conditions were as follows.

<First Anodizing Conditions>
  Current density: 7 ($mA/cm^2$)
  Anodizing solution: HF: $H_2O$: $C_2H_5OH$=1:1:1
  Process time: 11 (min)
  Porous Si thickness: 12 ($\mu$m)
<Second Anodizing Conditions>
  Current density: 21 ($mA/cm^2$)
  Anodizing solution: HF: $H_2O$: $C_2H_5OH$=1:1:1
  Process time: 2 (min)
  Porous Si thickness: 3 ($\mu$m)

A 0.1-$\mu$m thick single-crystal Si layer 13 was epitaxially grown on the porous Si layer 12 by CVD (Chemical Vapor Deposition) (FIG. 3C). The growth conditions were as follows. At the early stage of epitaxial growth, the surface of the porous Si layer 12 was exposed to $H_2$. Hence, holes on the surface were filled to form a flat surface.

<Epitaxial Growth Conditions>
  Source gas: $SiH_2Cl_2/H_2$
  Gas flow rate: 0.5/180 (l/min)
  Gas pressure: 80 (Torr)
  Temperature: 950 (° C.)
  Growth rate: 0.3 ($\mu$m/min)

A 400-nm thick $SiO_2$ layer 14 was formed on the surface of the epitaxially grown single-crystal Si layer 13 by thermal oxidation (FIG. 3D).

The surface of the $SiO_2$ layer and that of an independently prepared Si substrate (second substrate) 20 having a 400-nm thick oxide film on its surface were brought into tight contact with each other (FIG. 3E). After that, annealing including thermal oxidation was performed at 1,000° C. for 2 hrs (FIG. 3F).

With this thermal oxidation, the outer peripheral portion of the single-crystal Si layer (first layer) was oxidized, and the outer peripheral edge retreated toward the inside. Hence, a bonded substrate stack in which the outer peripheral edge of the single-crystal Si layer (first layer) was located inside the outer peripheral edge of the bonding region between the first substrate 10 and the second substrate 20 was obtained.

The above process may be executed such that the outer peripheral edge of a single-crystal Si layer 13a is located inside the outer peripheral edge of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but a polysilicon layer or amorphous Si layer may be formed.

Example 7

Example 7 provides a specific example of the second embodiment. In Example 7, a porous layer 12 having a two-layered structure formed from two porous layers having different porosities was formed.

First, a single-crystal Si substrate 11 used to form a first substrate 10 was prepared (FIG. 4A). The single-crystal Si substrate 11 was anodized in two steps in an HF solution to form a porous layer having a two-layered structure on the surface (FIG. 4B). The anodizing conditions were as follows.

<First Anodizing Conditions>
  Current density: 7 ($mA/cm^2$)
  Anodizing solution: HF: $H_2O$: $C_2H_5OH$=1:1:1
  Process time: 11 (min)
  Porous Si thickness: 12 ($\mu$m)
<Second Anodizing Conditions>
  Current density: 21 ($mA/cm^2$)
  Anodizing solution: HF: $H_2O$: $C_2H_5OH$=1:1:1
  Process time: 2 (min)
  Porous Si thickness: 3 ($\mu$m)

A 0.15-$\mu$m thick single-crystal Si layer 13 was epitaxially grown on the porous Si layer 12 by CVD (Chemical Vapor Deposition). The growth conditions were as follows. At the early stage of epitaxial growth, the surface of the porous Si layer 12 was exposed to $H_2$. Hence, holes on the surface were filled to form a flat surface.

<Epitaxial Growth Conditions>
  Source gas: $SiH_2Cl_2/H_2$
  Gas flow rate: 0.5/180 (l/min)
  Gas pressure: 80 (Torr)
  Temperature: 950 (° C.)
  Growth rate: 0.3 ($\mu$m/min)

A resist film was formed on the epitaxially grown single-crystal Si layer 13 to expose the outer peripheral portion (a portion separated from the outer peripheral edge by about 2 mm) and cover the inside portion. Using this resist film as a mask, the outer peripheral portion (the portion separated from the outer peripheral edge by about 2 mm) of the single-crystal Si layer 13 was removed by RIE (FIG. 4C).

A 100-nm thick $SiO_2$ layer 14 was formed on the single-crystal Si layer 13 and the exposed surface of the porous layer 12 by thermal oxidation (FIG. 4D).

The surface of the $SiO_2$ layer 14 and that of an independently prepared Si substrate (second substrate) 20 were brought into tight contact with each other and then annealed at 1,100° C. for 1 hr (FIG. 4E). At this time, the substrate may be oxidized.

With the above process, a bonded substrate stack in which the single-crystal Si layer 13 was located inside the outer peripheral edge of the bonding region between the first substrate 10 and the second substrate 20 was obtained.

The above process may be executed such that the outer peripheral portion of the single-crystal Si layer 13 is located inside the outer peripheral portion of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but, e.g., a Ge layer, SiC layer, compound semiconductor (e.g., GaAs, InP, or GaN) layer, or a metal layer may be formed. In this case, the $SiO_2$ layer 14 can be formed by, e.g., CVD. The first substrate and second substrate need not always be bonded via the $SiO_2$ layer 14.

Example 8

Example 8 provides another specific example of the second embodiment. In Example 8, a porous layer 12 having a two-layered structure formed from two porous layers having different porosities was formed.

First, a single-crystal Si substrate 11 used to form a first substrate 10 was prepared (FIG. 4A). The single-crystal Si substrate 11 was anodized in two steps in an HF solution to form a porous layer having a two-layered structure on the surface (FIG. 4B). The anodizing conditions were as follows.

<First Anodizing Conditions>
  Current density: 7 ($mA/cm^2$)
  Anodizing solution: HF: $H_2O$: $C_2H_5OH$=1:1:1
  Process time: 11 (min)
  Porous Si thickness: 12 ($\mu m$)
<Second Anodizing Conditions>
  Current density: 21 ($mA/cm^2$)
  Anodizing solution: HF: $H_2O$: $C_2H_5OH$=1:1:1
  Process time: 2 (min)
  Porous Si thickness: 3 ($\mu m$)

A 0.15-$\mu m$ thick single-crystal Si layer 13 was grown on the porous Si layer 12 by MBE or liquid phase growth (FIG. 4C). At this time, part of the outer peripheral portion (a portion separated from the outer peripheral edge by about 2 mm) of the porous layer 12 was covered with a shutter or a crucible of a solution to prevent the single-crystal Si layer from growing at this portion.

A 100-nm thick $SiO_2$ layer 14 was formed on the single-crystal Si layer 13 and the exposed surface of the porous layer 12 by thermal oxidation (FIG. 4D).

The surface of the $SiO_2$ layer 14 and that of an independently prepared Si substrate (second substrate) 20 were brought into tight contact with each other and then annealed at 1,100° C. for 1 hr (FIG. 4E). At this time, the substrate may be oxidized.

With the above process, a bonded substrate stack in which the outer peripheral edge of the single-crystal Si layer 13 was located inside the outer peripheral edge of the bonding region between the first substrate 10 and the second substrate 20 was obtained.

The steps shown in FIGS. 3G to 3J were performed to obtain an SOI substrate.

Example 9

Example 9 provides a specific example of the third embodiment. In Example 9, a porous layer 12 having a two-layered structure formed from two porous layers having different porosities was formed.

First, a single-crystal Si substrate 11 used to form a first substrate 10 was prepared (FIG. 5A). The single-crystal Si substrate 11 was anodized in two steps in an HF solution to form a porous layer having a two-layered structure on the surface (FIG. 5B). The anodizing conditions were as follows.

<First Anodizing Conditions>
  Current density: 7 ($mA/cm^2$)
  Anodizing solution: HF: $H_2O$: $C_2H_5OH$=1:1:1
  Process time: 11 (min)
  Porous Si thickness: 12 ($\mu m$)
<Second Anodizing Conditions>
  Current density: 21 ($mA/cm^2$)
  Anodizing solution: HF: $H_2O$: $C_2H_5OH$=1:1:1
  Process time: 2 (min)
  Porous Si thickness: 3 ($\mu m$)

A 0.15-$\mu m$ thick single-crystal Si layer 13 was epitaxially grown on the porous Si layer 12 by CVD (Chemical Vapor Deposition) (FIG. 5C). The growth conditions were as follows. At the early stage of epitaxial growth, the surface of the porous Si layer 12 was exposed to $H_2$. Hence, holes on the surface were filled to form a flat surface.

<Epitaxial Growth Conditions>
  Source gas: $SiH_2Cl_2/H_2$
  Gas flow rate: 0.5/180 (l/min)
  Gas pressure: 80 (Torr)
  Temperature: 950 (° C.)
  Growth rate: 0.3 ($\mu m$/min)

A 100-nm thick $SiO_2$ layer 14 was formed on the surface of the epitaxially grown single-crystal Si layer 13 by thermal oxidation (FIG. 5C).

A resist film was formed on the $SiO_2$ layer 14 to expose the outer peripheral portion (a portion separated from the outer peripheral edge by about 2 mm) and cover the inside portion. Using this resist film as a mask pattern, the outer peripheral portion of the $SiO_2$ layer 14 was removed by an etchant such as buffered hydrofluoric acid (FIG. 5D).

Using a patterned $SiO_2$ layer 14a as a mask pattern, the underlying single-crystal Si layer 13 was etched by, e.g., RIE and patterned (FIG. 5E). The resist film may be removed after patterning the $SiO_2$ layer 14 or after patterning the single-crystal Si layer 13.

The surface of the $SiO_2$ layer 14a and that of an independently prepared Si substrate (second substrate) 20 were brought into tight contact with each other (FIG. 5F). After that, annealing including thermal oxidation was performed at 1,000° C. for 2 hrs (FIG. 5G).

With this thermal oxidation, the outer peripheral portion of the single-crystal Si layer (first layer) was oxidized, and the outer peripheral edge retreated to the inside. Hence, a bonded substrate stack in which the outer peripheral edge of the single-crystal Si layer (first layer) was located inside the outer peripheral edge of the bonding region between the first substrate 10 and the second substrate 20 was obtained.

The above process may be executed such that the outer peripheral edge of a single-crystal Si layer 13a is located inside the outer peripheral edge of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but a polysilicon layer or amorphous Si layer may be formed.

Example 10

Example 10 provides a specific example of the fourth embodiment. In Example 10, a porous layer 12 having a two-layered structure formed from two porous layers having different porosities was formed.

First, a single-crystal Si substrate 11 used to form a first substrate 10 was prepared (FIG. 6A). The single-crystal Si substrate 11 was anodized in two steps in an HF solution to form a porous layer having a two-layered structure on the surface (FIG. 6B). The anodizing conditions were as follows.

<First Anodizing Conditions>

Current density: 7 ($mA/cm^2$)

Anodizing solution: HF: $H_2O$: $C_2H_5OH$=1:1:1

Process time: 11 (min)

Porous Si thickness: 12 ($\mu m$)

<Second Anodizing Conditions>

Current density: 21 ($mA/cm^2$)

Anodizing solution: HF: $H_2O$: $C_2H_5OH$=1:1:1

Process time: 2 (min)

Porous Si thickness: 3 ($\mu m$)

A 0.15-$\mu$m thick single-crystal Si layer 13 was epitaxially grown on the porous Si layer 12 by CVD (Chemical Vapor Deposition) (FIG. 6C). The growth conditions were as follows. At the early stage of epitaxial growth, the surface of the porous Si layer 12 is exposed to $H_2$. Hence, holes on the surface are filled to form a flat surface.

<Epitaxial Growth Conditions>

Source gas: $SiH_2Cl_2/H_2$

Gas flow rate: 0.5/180 (l/min)

Gas pressure: 80 (Torr)

Temperature: 950 (° C.)

Growth rate: 0.3 ($\mu m$/min)

A 100-nm thick $SiO_2$ layer 14 was formed on the surface of the epitaxially grown single-crystal Si layer 13 by thermal oxidation (FIG. 6D).

The surface of the $SiO_2$ layer 14 and that of an independently prepared Si substrate (second substrate) 20 were brought into tight contact with each other and then annealed at 1,100° C. for 1 hr (FIG. 6E). At this time, the bonded substrate stack may be oxidized.

The $SiO_2$ layer 14 at the outer peripheral portion of the bonded substrate stack was removed using an etchant such as buffered hydrofluoric acid (FIG. 6F).

The outer peripheral portion of the single-crystal Si layer 14 was etched using a solution mixture of hydrofluoric acid, nitric acid, and acetic acid (the mixing ratio was, e.g., 1:100:100) to locate the outer peripheral portion of the single-crystal Si layer inside the outer peripheral portion of the bonding region between the first substrate 10 and the second substrate 20 (FIG. 6G).

The above process may be executed such that the outer peripheral portion of the single-crystal Si layer 13 is located inside the outer peripheral portion of the bonding region between the first substrate 10 and the second substrate 20 only at a position of the entire side surface of the bonded substrate stack, where separation starts.

The steps shown in FIGS. 3G to 3J were performed to obtain an SOI substrate.

As the first layer 13, not the single-crystal Si layer but, e.g., a Ge layer, SiC layer, compound semiconductor (e.g., GaAs, InP, or GaN) layer, or a metal layer may be formed. In this case, the $SiO_2$ layer 14 can be formed by, e.g., CVD. The first substrate and second substrate need not always be bonded via the $SiO_2$ layer 14.

Example 11

Example 11 provides a specific example of the fifth embodiment.

First, a single-crystal Si substrate 11 used to form a first substrate 10 was prepared, and a 0.4-$\mu$m thick single-crystal Si layer 13 was epitaxially grown on the surface of the single-crystal Si substrate by CVD (Chemical Vapor Deposition). The growth conditions were as follows.

<Epitaxial Growth Conditions>

Source gas: $SiH_2Cl_2/H_2$

Gas flow rate: 0.5/180 (l/min)

Gas pressure: 80 (Torr)

Temperature: 950 (° C.)

Growth rate: 0.3 ($\mu m$/min)

A 200-nm thick $SiO_2$ layer 14 was formed on the surface of the epitaxially grown single-crystal Si layer 13 by thermal oxidation.

Hydrogen ions were implanted into the substrate via the surface $SiO_2$ layer at 40 keV and $5\times10^{16}$ $cm^{-2}$ to form a porous layer (microcavity layer) 12 at a pertained depth in the single-crystal Si substrate 11. With this process, a substrate as shown in FIG. 5C was obtained. This ion implantation can be executed using, e.g., an ion implantation apparatus using a beam or a batch implantation plasma apparatus using a plasma.

A resist film was formed on the $SiO_2$ layer 14 to expose the outer peripheral portion (a portion separated from the outer peripheral edge by about 2 mm) and cover the inside portion. Using this resist film as a mask pattern, the outer peripheral portion of the $SiO_2$ layer 14 was removed by an etchant such as buffered hydrofluoric acid (FIG. 5D).

Using a patterned $SiO_2$ layer 14a as a mask pattern, the underlying single-crystal Si layer 13 was etched by, e.g., RIE and patterned (FIG. 5E). The resist film may be removed after patterning the $SiO_2$ layer 14 or after patterning the single-crystal Si layer 13.

The surface of the $SiO_2$ layer 14 and that of an independently prepared Si substrate (second substrate) 20 having a 400-nm thick oxide film on its surface were subjected to surface activation using a nitrogen plasma, and then cleaned. After that, the surfaces of the two substrates were brought into tight contact with each other (FIG. 5F). Then, annealing may be performed at about 200° C. to firmly bond the substrates.

With the above process, a bonded substrate stack in which the outer peripheral edge of the single-crystal Si layer (first layer) matched the outer peripheral edge of the bonding region between the first substrate 10 and the second substrate 20 was obtained.

The above process may be executed such that the outer peripheral edge of the single-crystal Si layer is located inside the outer peripheral edge of the bonding region between the first substrate 10 and the second substrate 20 only at a position of the entire side surface of the bonded substrate stack, where separation starts.

The steps shown in FIGS. 3G to 3J were performed to obtain an SOI substrate.

Example 12

Example 12 provides another specific example of the fifth embodiment.

First, a single-crystal Si substrate 11 used to form a first substrate 10 was prepared. A 200-nm thick $SiO_2$ layer 14 was formed on the surface by thermal oxidation.

Hydrogen ions were implanted into the substrate via the surface $SiO_2$ layer 14 at 40 keV and $5\times10^{16}$ $cm^{-2}$ to form a porous layer (microcavity layer) 12 at a predetermined depth in the single-crystal Si substrate 11. With this process, a single-crystal Si layer 13 was formed between the porous layer 12 and the $SiO_2$ layer, and a first substrate as shown in FIG. 6D was obtained. This ion implantation can be executed using, e.g., an ion implantation apparatus using a beam or a batch implantation plasma apparatus using a plasma.

The surface of the $SiO_2$ layer 14 and that of an independently prepared Si substrate (second substrate) 20 having a 200-nm thick oxide film on its surface were subjected to surface activation using a nitrogen plasma, and then cleaned. After that, the surfaces of the two substrates were brought into tight contact with each other (FIG. 6E). Then, annealing may be performed at about 200° C. to firmly bond the substrates.

The $SiO_2$ layer 14 at the outer peripheral portion of the bonded substrate stack was removed using an etchant such as buffered hydrofluoric acid (FIG. 6F).

The outer peripheral portion of the single-crystal Si layer 14 was etched using a solution mixture of hydrofluoric acid, nitric acid, and acetic acid (the mixing ratio was, e.g., 1:100:100) to locate the outer peripheral portion of the single-crystal Si layer inside the outer peripheral portion of the bonding region between the first substrate 10 and the second substrate 20 (FIG. 6G).

The above process may be executed such that the outer peripheral portion of a single-crystal Si layer 13a is located inside the outer peripheral portion of the bonding region between the first substrate 10 and the second substrate 20 only at a position of the entire side surface of the bonded substrate stack, where separation starts.

The steps shown in FIGS. 3G to 3J were performed to obtain an SOI substrate.

Example 13

Example 13 provides a specific example of the process of separating a bonded substrate stack prepared according to Examples 1 to 12 to form a semiconductor substrate such as an SOI substrate. This corresponds to the steps shown in FIGS. 3G to 3J.

While rotating a bonded substrate stack, a fluid (e.g., a liquid such as water or a gas such as nitrogen or air) focused to a diameter of, e.g., 0.2 mm was ejected to the gap at the outer peripheral portion of the bonded substrate stack to separate the bonded substrate stack into two substrates with this fluid (FIG. 3G). A method using water as the fluid is called a water jet method. Separation of the bonded substrate stack started from the bonding interface, as indicated by an arrow D in FIG. 3G and reached a porous layer 12 obliquely across the $SiO_2$ layer toward the inside of the substrate. After that, separation progressed only at the portion of the porous layer 12.

Separation did not progress along the interface between the $SiO_2$ layer and the single-crystal Si layer. In addition, the single-crystal Si layer was not largely broken. Hence, defects (large decrease in the region of the single-crystal Si layer) in separation were not produced. However, since separation progresses toward the inside of the substrate obliquely across the $SiO_2$ layer, the area of the single-crystal Si layer slightly reduces within an allowable range.

For a bonded substrate stack (to be referred to as a substrate for which the separation start position was designated hereinafter) in which the outer peripheral portion of the single-crystal Si layer was located inside the outer peripheral portion of the bonding region between a first substrate 10 and a second substrate 20 only at a position (to be referred to as a separation start position hereinafter) of the entire side surface of the bonded substrate stack, where separation starts, a satisfactory result was obtained, as in the above example. In this case, however, the fluid must be ejected toward the separation start position at the start of separation.

With this separation, a substrate schematically shown in FIG. 3H was obtained. Next to the separation step (FIG. 3G), a porous layer 12a remaining on a second substrate 20a side was selectively etched using a solution mixture of 49% hydrofluoric acid, 30% hydrogen peroxide, and water (FIG. 3I). A single-crystal Si layer 13a under the porous layer 12a functions as an etching stopper layer. The etching rate for non-porous single-crystal Si is much lower than that for porous Si, and the selectivity ratio of etching between porous Si (porous layer 12a) to non-porous Si (single-crystal Si layer 13a) by the above solution mixture is $10^5$ or more. Hence, the decrease in film thickness of the single-crystal Si layer 13a in this etching process can be neglected in practical use.

Next, the $SiO_2$ layer remaining at the outer peripheral portion of the substrate was removed (FIG. 3J). This process need not always be performed.

When the film thickness of the single-crystal Si layer of the SOI substrate (FIG. 3J) formed by the above process was measured at 100 points on the entire surface. The film thickness variation was ±3%.

This substrate was annealed in hydrogen at 1,100° C. for 1 hr, and the surface roughness was evaluated with an atomic force microscope. The mean square roughness in a 50-μm square area was approximately 0.2 nm. This nearly equals that of a commercially available Si substrate.

Section observation with a transmission electron microscope revealed no crystal defects in the single-crystal Si layer, indicating that satisfactory crystallinity was obtained.

For the first substrate that is one of the two separated substrates, the porous Si layer remaining on the surface was selectively etched using a solution mixture of 49% hydrofluoric acid, 30% hydrogen peroxide, and water. The single-crystal Si layer 13a under the porous layer 12a functions as an etching stopper layer. The substrate obtained by this process could be used as a single-crystal Si substrate 11 used to form the first substrate 10 or a second substrate 20.

Before reuse of the separated first substrate, the substrate may be annealed in hydrogen at 1,100° C. for 1 hr to recover the surface roughness (microroughness) due to microholes. However, when the separated first substrate is to be reused as a substrate 11 used to form a first substrate, the above microroughness planarization is not always necessary because the surface is planarized simultaneously with sealing holes on the surface of the porous layer during prebaking in hydrogen at the early stage of epitaxial growth. Instead of annealing in hydrogen, the microroughness due to microholes may be planarized by surface touch polishing.

To remove the porous Si layer, not only the solution mixture but also another etchant (e.g., hydrofluoric acid, nitric acid, or acetic acid) for etching Si can be used. The porous Si layer can also be formed by polishing.

When a polysilicon layer or amorphous Si layer is formed as the first layer on the substrate to be reused, the planarization need not always be performed. When a layer other than an Si layer is formed as the first layer, the substrate can be directly reused by polishing the surface on the first substrate side after separation of the bonded substrate stack.

Example 14

Separation using a fluid in Example 13 can be replaced with the following separation step.

(1) Separation Using Wedge

When a thin wedge of, e.g., a resin is gradually inserted into the gap at the outer peripheral portion of a bonded substrate stack (the separation start position of a substrate for which the separation start position is designated), the bonded substrate stack is separated into two substrates.

It was confirmed that separation did not progress along the interface between the $SiO_2$ layer and the single-crystal Si layer, and defects (large decrease in the region of the single-crystal Si layer) in separation were not produced. However, since separation progresses toward the inside of the substrate obliquely across the $SiO_2$ layer, the area of the single-crystal Si layer slightly reduces within an allowable range.

(2) Separation by Peeling

One surface of a bonded substrate stack is fixed, and the other surface is pulled in the axial direction of the bonded substrate stack using a flexible tape or the like, thereby separating the bonded substrate stack at the porous layer. For a substrate for which the separation start position is designated, separation is started from the separation start position.

(3) Separation Using Shearing Stress

One surface of a bonded substrate stack is fixed, and a force is applied to the other surface to move the other surface in the planar direction of the bonded substrate stack, thereby separating the bonded substrate stack at the porous layer by shearing stress.

(4) Separation Using Ultrasonic Wave

An ultrasonic wave is supplied to a bonded substrate stack to break the porous layer with the ultrasonic wave, thereby separating the bonded substrate stack at the porous layer.

[Others]

In the above examples, to grow the first layer on the porous layer, not only CVD but also various methods such as MBE, sputtering, and liquid phase growth can be employed.

In the above examples, as the etchant used for selective etching of the porous Si layer, not only the solution mixture of 49% hydrofluoric acid, 30% hydrogen peroxide, and water but also various etchants such as a) a solution mixture of hydrofluoric acid and water, b) a solution mixture prepared by adding at least one of an alcohol and hydrogen peroxide to a solution mixture of hydrofluoric acid and water, c) buffered hydrofluoric acid, d) a solution mixture prepared by adding at least one of an alcohol and hydrogen peroxide to buffered hydrofluoric acid, and e) a solution mixture of hydrofluoric acid, nitric acid, and acetic acid can be employed.

According to the present invention, defects in separation of a bonded substrate stack can be prevented.

The present invention is not limited to the above embodiments and various changes and modifications can be made within the spirit and scope of the present invention. Therefore, to apprise the public of the scope of the present invention, the following claims are made.

What is claimed is:

1. A method of manufacturing a bonded substrate stack comprising:

the first step of preparing a first substrate having a porous layer inside, a first layer abutting said porous layer, and a second layer abutting said first layer;

the second step of bonding a major surface of said second layer to a second substrate to prepare a bonded substrate stack; and the third step of chemically processing said bonded substrate stack to make at least part of an outer peripheral edge of said first layer retreat toward the inside of said bonded substrate stack.

2. The method according to claim 1, wherein the third step comprises chemically processing said bonded substrate stack to obtain a structure in which said at least part of the outer peripheral edge of said first layer of said bonded substrate stack is located at or inside an outer peripheral edge of a region where said first substrate and said second substrate are bonded.

3. The method according to claim 1, wherein the third step comprises the step of oxidizing said at least part of the outer peripheral portion of said first layer of said bonded substrate stack prepared in the second step.

4. The method according to claim 1, wherein the third step comprises the step of etching said at least part of the outer peripheral edge of said first layer of said bonded substrate stack prepared in the second step.

5. The method according to claim 1, wherein said first layer is a semiconductor layer.

6. The method according to claim 1, wherein said first layer is an Si layer.

7. The method according to claim 1, wherein said first layer is a single-crystal Si layer.

8. The method according to claim 1, wherein said first layer is a compound semiconductor layer.

9. The method according to claim 1, wherein the first step comprises the step of anodizing an Si substrate to form said porous layer.

10. The method according to claim 1, wherein the first step comprises the step of implanting ions into an Si substrate to form said porous layer.

11. The method according to claim 1, wherein said first layer is an Si layer, and said second layer is an $SiO_2$ layer.

12. The method according to claim 1, wherein the first step comprises:

the step of forming an Si layer serving as said first layer on said porous layer; and the step of thermally oxidizing a surface of said Si layer to form an $SiO_2$ layer serving as said second layer on said Si layer.

13. The method according to claim 1, wherein said second substrate is one of an Si substrate and a substrate having an $SiO_2$ layer on a surface of an Si substrate.

14. The method according to claim 1, wherein said second substrate is one of a transparent substrate and an insulating substrate.

15. A method of manufacturing a substrate, comprising:

the step of preparing a bonded substrate stack by the bonded substrate stack manufacturing method of claim 1; and the step of separating said prepared bonded substrate stack into two substrates at said porous layer.

16. The method according to claim 15, further comprising the step of removing a porous layer remaining on a surface on a second substrate side of the two substrates separated in the separation step.

17. The method according to claim 15, further comprising the step of removing a porous layer remaining on a first substrate side of the two substrates separated in the separation step to enable reuse of the first substrate.

18. The method according to claim 15, wherein the separation step comprises ejecting a fluid to a portion near a bonding interface of said bonded substrate stack and separating said bonded substrate stack into two substrates at said porous layer by the fluid.

19. A method of manufacturing a bonded substrate stack, comprising:
the first step of preparing a first substrate having a porous layer inside, a first layer in a predetermined region on said porous layer, and a second layer that covers an upper surface and at least part of a side surface of said first layer; and
the second step of bonding a major surface of said first substrate to a second substrate to prepare a bonded substrate stack.

20. The method according to claim 19, wherein the first step comprises, after the second step, forming said first layer and said second layer to obtain a structure in which at least part of an outer peripheral edge of said first layer is located inside an outer peripheral edge of a region where said first substrate and said second substrate are bonded.

21. The method according to claim 20, wherein the first step comprises the step of growing said first layer having a predetermined shape on said porous layer.

22. The method according to claim 19, wherein the first step comprises the step of forming a layer of a predetermined material on a substantially entire surface of said porous layer and pattering the layer of predetermined material to form said first layer.

23. The method according to claim 19, wherein said first layer is a semiconductor layer.

24. The method according to claim 19, wherein said first layer is an Si layer.

25. The method according to claim 19, wherein said first layer is a single-crystal Si layer.

26. The method according to claim 19, wherein said first layer is a compound semiconductor layer.

27. The method according to claim 19, wherein the first step comprises the step of anodizing an Si substrate to form said porous layer.

28. The method according to claim 19, wherein said first layer is an Si layer, and said second layer is an $SiO_2$ layer.

29. The method according to claim 19, wherein the first step comprises:
the step of forming an Si layer serving as said first layer on said porous layer; and
the step of thermally oxidizing a surface of a substrate having said Si layer to form an $SiO_2$ layer serving as said second layer.

30. The method according to claim 19, wherein said second substrate is one of an Si substrate and a substrate having an $SiO_2$ layer on a surface of an Si substrate.

31. The method according to claims 19, wherein said second substrate is one of a transparent substrate and an insulating substrate.

32. A method of manufacturing a bonded substrate stack, comprising:
the first step of preparing a first substrate having a porous layer inside, a first layer on a portion other than an outer peripheral portion of said porous layer, and a second layer that covers an upper surface of said first layer; and
the second step of bonding a major surface of said second layer to a second substrate to prepare a bonded substrate stack,
wherein said bonded substrate stack results in at least part of an outer peripheral edge of the first layer that is inside an outer peripheral edge of the region where the second layer is bonded to the second substrate.

33. The method according to claim 32, wherein the first step comprises preparing said first substrate having a structure in which the position of an outer peripheral edge of said first layer substantially matches that of an outer peripheral edge of said second layer.

34. The method according to claim 32, further comprising the third step of chemically processing said bonded substrate stack prepared in the second step to locate at least part of an outer peripheral edge of said first layer at or inside an outer peripheral edge of a region where said first substrate and said second substrate are bonded.

35. The method according to claim 34, wherein the third step comprises the step of oxidizing an outer peripheral portion of said bonded substrate stack prepared in the second step.

36. The method according to claim 32, wherein said first layer is a semiconductor layer.

37. The method according to claim 32, wherein said first layer is an Si layer.

38. The method according to claim 32, wherein said first layer is a single-crystal Si layer.

39. The method according to claim 32, wherein said first layer is a compound semiconductor layer.

40. The method according to claim 32, wherein the first step comprises the step of anodizing an Si substrate to form said porous layer.

41. The method according to claim 32, wherein said second substrate is one of an Si substrate and a substrate having an $SiO_2$ layer on a surface of an Si substrate.

42. The method according to claim 32, wherein said second substrate is one of a transparent substrate and an insulating substrate.

43. A method of manufacturing a bonded substrate stack, comprising:
the first step of preparing a first substrate having a porous layer inside, a first layer on a portion other than an outer peripheral portion of said porous layer, and a second layer that covers an upper surface of said first layer; and
the second step of bonding a major surface of said first substrate to a second substrate to prepare a bonded substrate stack;
wherein the first step comprises the step of forming a lower layer of a first material on a substantially entire surface of said porous layer, the step of forming an upper layer of a second material on a substantially entire surface of said lower layer, the step of removing an outer peripheral portion of said upper layer to form said second layer, and the step of removing an outer peripheral portion of said lower layer using said second layer as a mask pattern to form said first layer.

44. A method of manufacturing a bonded substrate stack, comprising:
the first step of preparing a first substrate having a porous layer inside, a first layer on a portion other than an outer peripheral portion of said porous layer, and a second layer that covers an upper surface of said first layer; and
the second step of bonding a major surface of said first substrate to a second substrate to prepare a bonded substrate stack;
wherein the first step comprises the step of forming an Si layer on a substantially entire surface of said porous layer, the step of thermally oxidizing a surface of a substrate having said Si layer to form an $SiO_2$ layer, the step of removing an outer peripheral portion of said $SiO_2$ layer to form said second layer, and the step of removing an outer peripheral portion of said Si layer using said second layer as a mask pattern to form said first layer.

45. A method of manufacturing a bonded substrate stack, comprising:
the first step of preparing a first substrate having a porous layer inside, and a first layer abutting said porous layer;
the second step of bonding a major surface of said first layer to a second substrate to prepare a bonded substrate stack; and
the third step of chemically processing said bonded substrate stack to make at least part of an outer peripheral edge of said first layer retreat toward the inside of said bonded substrate stack.

46. The method according to claim 45, wherein the third step comprises the step of oxidizing said at least part of the outer peripheral portion of said first layer of said bonded substrate stack prepared in the second step.

47. The method according to claim 45, wherein the third step comprises the step of etching said at least part of the outer peripheral edge of said first layer of said bonded substrate stack prepared in the second step.

48. A bonded substrate stack, comprising:
a first substrate having a porous layer inside, including,
a first layer abutting said porous layer, and
a second layer abutting said first layer; and
a second substrate bonded to a major surface of said second layer,
wherein said bonded substrate stack has at least part of an outer peripheral edge of said first layer retreat toward the inside of said bonded substrate stack.

49. A bonded substrate stack having a structure in which a major surface of a first substrate having a porous layer inside, a first layer abutting said porous layer, and a second layer abutting said first layer is bonded to a second substrate, wherein
an outer peripheral edge of said first layer is separated from an outer peripheral edge of said bonded substrate stack by a predetermined distance toward the inside.

50. A bonded substrate stack having a structure in which a major surface of a first substrate having a porous layer inside, a first layer abutting said porous layer and a second layer abutting said first layer is bonded to a second substrate, wherein
an outer peripheral edge of said first layer is located inside an outer peripheral edge of said second layer.

51. A bonded substrate stack having a structure in which a major surface of a first substrate having a porous layer inside, a first layer abutting said porous layer, and a second layer abutting said first layer is bonded to a second substrate, wherein
an outer peripheral edge of said first layer is located inside an outer peripheral edge of a region where said first substrate and said second substrate are bonded.

52. A method of manufacturing a bonded substrate stack, comprising the process step of chemically processing a bonded substrate stack in which a major surface of a first substrate having a porous layer inside, a first layer abutting said porous layer, and a second layer abutting said first layer is bonded to a second substrate to make at least part of an outer peripheral edge of said first layer retreat toward the inside of said bonded substrate stack.

53. The method according to claim 52, wherein the process step comprises chemically processing said bonded substrate stack to obtain a structure in which said at least part of the outer peripheral edge of said first layer of said bonded substrate stack is located at or inside an outer peripheral edge of a region where said first substrate and said second substrate are bonded.

54. The method according to claim 52, wherein the process step comprises the step of oxidizing said at least part of the outer peripheral portion of said first layer of said bonded substrate stack.

55. The method according to claim 52, wherein the process step comprises the step of etching said at least part of the outer peripheral edge of said first layer of said bonded substrate stack.

56. The method according to claim 52, wherein said first layer is a semiconductor layer.

57. The method according to claim 52, wherein said first layer is an Si layer.

58. The method according to claim 52, wherein said first layer is a single-crystal Si layer.

59. The method according to claim 52, wherein said first layer is a compound semiconductor layer.

60. The method according to claim 52, wherein said porous layer of said first substrate is a porous layer formed by anodizing an Si substrate.

61. The method according to claim 52, wherein said porous layer of said first substrate is a porous layer formed by implanting ions into an Si substrate.

62. The method according to claim 52, wherein said first layer is an Si layer, and said second layer is an $SiO_2$ layer.

63. The method according to claim 52, wherein said second substrate is one of an Si substrate and a substrate having an $SiO_2$ layer on a surface of an Si substrate.

64. The method according to claim 52, wherein said second substrate is one of a transparent substrate and an insulating substrate.

* * * * *

UNITED STATES PATENT AND TRADEMARK OFFICE
CERTIFICATE OF CORRECTION

PATENT NO.     : 6,624,047 B1
DATED          : September 23, 2003
INVENTOR(S)    : Kiyofumi Sakaguchi et al.

It is certified that error appears in the above-identified patent and that said Letters Patent is hereby corrected as shown below:

Column 6,
Line 47, "is a n Si" should read -- is an Si --
Line 48, "is a n $SiO_2$" should read -- is an $SiO_2$ --

Column 9,
Line 2, "layer On the" should read -- layer on the --

Column 11,
Line 55, "second substrate at" should read -- second substate 20 at --

Column 13,
Line 28, "substrate is" should read -- substrate 20 is --

Column 20,
Line 20, "an H atmosphere," should read -- an $H_2$ atmosphere, --

Column 31,
Line 4, "first substrate as" should read -- first substrate 10 as --

Signed and Sealed this

Sixth Day of April, 2004

JON W. DUDAS
*Acting Director of the United States Patent and Trademark Office*